(12) United States Patent
Saita

(10) Patent No.: US 6,888,391 B2
(45) Date of Patent: May 3, 2005

(54) CLOCK GENERATING CIRCUIT AND CLOCK GENERATING METHOD

(75) Inventor: Takahiro Saita, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 104 days.

(21) Appl. No.: 10/306,314

(22) Filed: Nov. 27, 2002

(65) Prior Publication Data

US 2003/0098733 A1 May 29, 2003

(30) Foreign Application Priority Data

Nov. 29, 2001 (JP) ........................................ 2001-364570

(51) Int. Cl.[7] ................................................ H03K 3/00
(52) U.S. Cl. ........................................ 327/291; 327/107
(58) Field of Search ................................ 327/291, 299, 327/105, 107, 108, 292

(56) References Cited

U.S. PATENT DOCUMENTS

| 3,737,790 A | | 6/1973 | Brown | |
|---|---|---|---|---|
| 4,065,721 A | | 12/1977 | Rabe | |
| RE34,750 E | * | 10/1994 | Ohmori | ........................ 347/131 |
| 6,545,518 B2 | * | 4/2003 | Saeki | ........................... 327/116 |

FOREIGN PATENT DOCUMENTS

| DE | 195 34 785 C 1 | 1/1997 |
|---|---|---|
| DE | 696 09 488 T 2 | 11/1997 |
| GB | 2 208 576 A | 4/1989 |
| JP | 08-204450 | 8/1996 |
| JP | 10-004347 | 1/1998 |
| JP | 2000-293258 | 10/2000 |

OTHER PUBLICATIONS

English translation of the above–mentioned office action.

* cited by examiner

*Primary Examiner*—Timothy P. Callahan
*Assistant Examiner*—Cassandra Cox
(74) *Attorney, Agent, or Firm*—Darryl G. Walker; Bradley T. Sako

(57) ABSTRACT

A clock generating circuit (100) that may prevent an erroneous clock signal from being provided to an internal logic circuit (105) has been disclosed. A clock generating circuit (100) may include a variable voltage generating circuit (101), an oscillating circuit (103), and a control circuit (104). Oscillating circuit (103) may provide an original clock signal (157). A charging circuit (122, 123, and 124) may provide charging of a signal (159) when an original clock signal (157) achieves a predetermined amplitude. When signal (157) charges sufficiently, an oscillation stabilization signal may be provided to enable the generation of a synthesized clock signal (160). Also, at this time, a reduced voltage (170) may be provided to power an oscillating circuit (103). In this way, current consumption may be reduced and failures due to providing an erroneous clock signal to an internal logic circuit may be reduced.

26 Claims, 18 Drawing Sheets

CLOCK GENERATING CIRCUIT AND CLOCK GENERATING METHOD

TECHNICAL FIELD

The present invention relates generally to a clock generating circuit and more particularly to a clock generating circuit including a circuit for reducing an oscillation stabilization waiting time period and for reducing power consumption and a clock generating method.

BACKGROUND OF THE INVENTION

A semiconductor integrated circuit including an oscillator conventionally will use an external power supply voltage to provide power to the oscillator. However, another conventional approach is to use a regulated voltage to provide power to an oscillator to reduce power consumption.

A reset disables the oscillator. However, when a reset is terminated or cancelled, conventionally, it is necessary for an oscillator to operate for a sufficient time period (initialization time period) after the cancellation of the reset. Such an initialization time period can allow an oscillating element to provide an oscillation signal to grow, in order to be large enough for proper operation. This initialization time period is conventionally ensured by using a clock of the oscillator per se, or by using an exclusive counter.

However, another conventional approach of ensuring the proper initialization time period is by using an external capacitor and resister to provide an RC time constant.

A conventional clock generating circuit is disclosed in Japanese Patent Application Laid-Open 8-204450 (JP 8-204450 A) and will be explained with reference to FIGS. 9 and 10. Referring to FIG. 9, a circuit schematic diagram of a conventional clock generating circuit is set forth and given the general reference character 900. FIG. 10 is a timing diagram showing the operation of conventional clock generating circuit 900 in a power up. Power up may occur when power is initially applied to a device, or after a reset.

Referring to FIG. 9, conventional clock generating-circuit 900 includes an oscillating circuit 910, a constant voltage generating circuit 920, a level conversion circuit 930, and a logic circuit 940.

Constant voltage generating circuit 920 includes a voltage regulator 922 and a switching means 924. Switching means 924 switches an operation power supply voltage VOSC supplied to oscillating circuit 910 in accordance with a start control signal (START CONTROL SIGNAL) pulse width. Such a pulse may be generated upon power up and, ideally, terminate some time after the oscillating circuit 910 provides a stable oscillation OSCCLK1.

Referring now to FIG. 10 in conjunction with FIG. 9, when start control signal is logic high, a power supply voltage VDD is provided as the operation power supply voltage VOSC of oscillating circuit 910. After oscillation stabilization, start control signal (START CONTROL SIGNAL) transitions to a low level and switching means 924 provides a constant voltage from voltage regulator 922 as operation power supply voltage VOSC of oscillating circuit 910. In this way, the operation power supply voltage VOSC of oscillating circuit 910 can be reduced during the operation of logic circuit 940 and power consumption during normal operation of a semiconductor integrated circuit may be reduced.

Another conventional clock generating circuit is disclosed in Japanese Patent Application Laid-Open 10-004347 (JP 10-004347 A) and will be explained with reference to FIGS. 11 and 12. Referring to FIG. 11, a circuit schematic diagram of a conventional clock generating circuit is set forth and given the general reference character 1100. FIG. 12 is a timing diagram showing the operation of conventional clock generating circuit 1100 after a reset.

Conventional clock generating circuit 1100 includes an oscillating circuit 1110, a counter 1120, and a RC oscillator 1130. RC oscillator 1130 becomes stable in a much shorter time period and has a much larger oscillation period than oscillating circuit 1110.

Referring now to FIG. 12 in conjunction with FIG. 11, after clock stop signal S1 goes low, oscillating circuit 1110 and RC oscillator 1130 provide oscillating signals (S2 and S3), respectively. Buffer circuit 1140 provides an output S4 that transitions when oscillating signal S2 reaches input levels ($V_H$ and $V_L$). Counter 1120 counts the number of cycles of output S4 during a logic high period of oscillating signal S3 provided from RC oscillator 1130 as a reset input to counter 1120. If the number of cycles counted by counter 1120 becomes a predetermined number (in this case, such that counter output signals S5 to S8 are all high), the oscillating circuit 1110 is determined to be stabilized. After the oscillating circuit is stabilized such that buffer 1140 provides a predetermined frequency, latch 1150 provides an output S9 that is logic high and AND gate 1160 is enabled to provide a clock signal S10.

Another conventional clock generating circuit is disclosed in Japanese Patent Application Laid-Open 2000-293258 (JP 2000-293258 A) and will be explained with reference to FIGS. 13 and 14. Referring to FIG. 13, a circuit schematic diagram of a conventional clock generating circuit is set forth and given the general reference character 1300. FIG. 14 is a timing diagram showing the operation of conventional clock generating circuit 1300 after a reset.

Conventional clock generating circuit 1300 includes an oscillating circuit 1310, counters (1320 and 1330), a judging circuit 1340, a clock generating circuit 1350, a buffer 1302, and an inverter 1303.

Referring now to FIG. 14 in conjunction with FIG. 13, buffer 1302 detects the positive edge of an output signal 702 of oscillating circuit 1310 and has a high threshold value. Inverter 1303 detects the negative edge of output signal 702 of oscillating circuit 1310 and has a low threshold value. Counter 1320 counts the clock cycles provided by buffer 1302 and counter 1330 counts the clock cycles provided by inverter 1303. After N-1 counts, the values of counters (1320 and 1330) are coincidence, a N-1 coincidence signal (internal to judging circuit 1340 and not illustrated in FIG. 13) is generated and judging circuit 1340 generates a permission signal 709. In response to permission signal 709, clock generating circuit 1350 provides a clock output based on output signal 702 of oscillating circuit 1310. After N counts by either counter (1320 or 1330), the values of counters (1320 and 1330) are reset by a N signal 705 provided by judging circuit 1340. At this time, if N-1 coincidence signal has not been generated, permission signal 709 is reset (or not generated). In this way, a clock signal is not provided until an output signal 702 of an oscillating circuit 1310 has provided N-1 cycles with both a minimum and a maximum voltage value so that the oscillating circuit 1310 is judged to be stabilized.

Another conventional clock generating circuit is used in an 8-bit single chip microcomputer 78K0 and 78K0/s series by Nippon Denki (NEC) and will be explained with reference to FIGS. 15 and 16. Referring to FIG. 15, a circuit schematic diagram of a conventional clock generating circuit is set forth and given the general reference character 1500. FIG. 16 is a timing diagram showing the operation of conventional clock generating circuit 1500 after a reset.

Conventional clock generating circuit 1500 includes an oscillating circuit 1510, a clock output circuit 1520, and a logic circuit 1530. An exclusive counter 1522 in clock output circuit 1520 counts the oscillation clock OSCCLK1 provided by oscillating circuit 1510 after a reset is cancelled (reset signal RESET goes high as seen in FIG. 16). When the count value in exclusive counter 1522 reaches a predetermined value, a count signal CNT1 becomes high and an output Q is provided by a flip-flop circuit 1524 in clock output circuit 1520. In this way, AND gate 1526 in clock output circuit 1520 is enabled to provide a clock signal CLK based on the oscillation clock OSCCLK1 provided by oscillating circuit 1510.

Another conventional clock generating circuit is used in a μPD780955/μPD780958 single chip microcontroller by Nippon Denki (NEC) and will be explained with reference to FIGS. 17 and 18. Referring to FIG. 17, a circuit schematic diagram of a conventional clock generating circuit is set forth and given the general reference character 1700. FIG. 18 is a timing diagram showing the operation of conventional clock generating circuit 1700 after a reset.

Conventional clock generating circuit 1700 differs from conventional clock generating circuit 1500 in that reset signal RESET is generated by an RC circuit 1710. Reset signal RESET is provided to a constant voltage generating circuit 1720. Constant voltage generating circuit 1720 includes a voltage regulator 1722 and a switching means 1724. When reset signal RESET is low, a power supply of voltage VDD is provided to the oscillation circuit 1730 and logic circuit 1740. However after reset signal RESET becomes logic high, a regulator voltage output provided by voltage regulator 1722 is provided to the oscillation circuit 1730 and logic circuit and logic circuit 1740. Thus, the operation voltage is switched after oscillation circuit 1730 is stabilized.

In conventional clock generating circuit 1500 of FIG. 15, current consumption may be increased because logic circuit 1530 and oscillation circuit 1510 are always operated by an external power supply voltage VDD after power is turned on.

In conventional clock generating circuit 900, the oscillating circuit 910 is operated by the voltage provided by voltage regulator 922 when the oscillating circuit 910 provides a stabile oscillation. In this way, power consumption may be reduced. However, because a variation can occur in the time necessary for the oscillating circuit 910 to stabilize, the start control signal START CONTROL SIGNAL may end prior to sufficient stabilization being achieved.

In conventional clock generating circuit 1500, stabilization of oscillation circuit 1510 is determined by counting the clock OSCCLK1 directly with exclusive counter 1522. However, when the reset is cancelled, as oscillation starts, an oscillating frequency provided by oscillation circuit 1510 may be undesirably high. Thus, depending upon how high a frequency is being output, a resulting count may not be correctly conducted. As a result, a time difference may occur between when the oscillation circuit 1510 is actually stabilized and when output Q of flip-flop 1524 goes high to enable the generation of clock CLK. Such a variation can cause an erroneous generation of clock CLK.

In conventional clock generating circuit 1700, the oscillation circuit 1720 is operated by providing a voltage provided by voltage regulator 1722 to lower power consumption when the oscillation of oscillation circuit 1720 is stabilized. However, RC circuit 1710 can require a large capacitor and resistor external to the chip. These external components increase costs. Also, the values of the capacitor and resistors may need to be tuned in accordance with the device operating parameters.

That is, RC circuit 1710 is provided to a reset terminal external to the chip in order to provide a time delay to ensure that oscillation circuit 1730 is stabilized. Such a delay is dependent upon a time constant of such an RC circuit. However, to ensure a sufficient time delay until oscillation circuit 1730 is stabilized, a very large capacitor and resistor can be required. This can increase manufacturing costs and therefore the cost to the customer is increased. Further, because the time period until the oscillation circuit 1730 is stabilized may vary between use methods and device samples, the capacitor and resistor must be specifically tuned.

In conventional clock generating circuit 1100, even if a Schmidt trigger inverter is used as buffer circuit 1140, an incorrect oscillation in the vicinity of the threshold value may not be distinguished from a correct oscillation. This is because the Schmidt trigger inverter operates even when an incorrect oscillation is made. As a result, the counter 1120 may receive an input caused by such an incorrect oscillation. In this way, the time period provided to ensure the oscillation of oscillation circuit 1110 to become stabilized can be adversely affected.

Also, conventional clock generating circuits (900 and 1700) provide a time delay not based on the output of oscillation circuits. Thus, the time period provided to ensure oscillation stabilization may be unnecessarily long and a time delay before proper operation may increase. Accordingly, because the time period until the oscillation is stabilized is not practically detected but instead experimentally predicted, a time delay must be set in accordance with a worst case condition.

In view of the above discussion, it would be desirable to provide a clock generating circuit that may have low power consumption when an oscillating circuit and a logic circuit operates when compared with conventional approaches.

It would also be desirable to provide a clock generating circuit that can provide a shorter oscillation stabilization wait time than conventional approaches. It would also be desirable to provide a clock generating circuit which may provide a shorter oscillation stabilization wait time with reduced adverse affects due to variation in characteristics of an oscillating element or the like.

It would also be desirable to provide a clock generating circuit which may provide a shorter oscillation stabilization wait time and may provide a timing for automatically switching an oscillating circuit and/or an internal logic circuit from an external power supply voltage to a reduced voltage supply.

It would also be desirable to provide a clock generating circuit which may be capable of preventing a system with an oscillating circuit from supplying an oscillation clock to an internal logic circuit when the oscillation clock is unstable to thereby reduce system malfunctions.

SUMMARY OF THE INVENTION

According to the present embodiments, a clock generating circuit that may prevent an erroneous clock signal from being provided to an internal logic circuit is disclosed. A clock generating circuit may include a variable voltage generating circuit, an oscillating circuit, and a control circuit. An oscillating circuit may provide an original clock signal. A charging circuit may provide charging of a signal when an original clock signal achieves a predetermined amplitude. When a signal charges sufficiently, an oscillation stabilization signal may be provided to enable the generation of a synthesized clock signal. Also, at this time, a reduced voltage may be provided to power an oscillating circuit. In this way, current consumption may be reduced and failures due to providing an erroneous clock signal to an internal logic circuit may be reduced.

According to one aspect of the embodiments, a clock generating circuit may include an oscillation circuit, a charge control circuit, a first logic circuit, and a synthesized clock generating circuit. An oscillation circuit may generate an original clock signal. A charge control circuit may provide charge to a charge node when an amplitude of the original clock signal becomes at least a first predetermined value. A first logic circuit may generate a first control signal. The first control signal may have a first logic level in an initial state and may transition to a second logic level in response to a potential of the charge node becoming a second predetermined value. A synthesized clock generating circuit may provide a synthesized clock to another circuit not included in the clock generating circuit in accordance with the first control signal and the original clock signal.

According to another aspect of the embodiments, the charge control circuit may include a buffer that may receive the original clock signal and provide a charge control signal that controls the charge to the charge node. The buffer may have hysteresis.

According to another aspect of the embodiments, a clock generating circuit may include an oscillation circuit, a first measuring circuit, a second measuring circuit, a first logic circuit, and a synthesized clock generating circuit. An oscillation circuit may generate an original clock signal. A first measuring circuit may measure a first time period in which the original clock signal is at least a first threshold value. A second measuring circuit may measure a second time period in which the original clock signal is at most a second threshold value. A first logic circuit may generate a first control signal. The first control signal may have a first logic level in an initial state and may transition to a second logic level in response to the first time period being essentially equal to the second time period. A synthesized clock generating circuit may provide a synthesized clock to another circuit not included in the clock generating circuit in accordance with the first control signal and the original clock signal.

According to another aspect of the embodiments, the clock generating circuit may include a switching circuit that switches a power supply provided to the oscillation circuit in response to the first control signal.

According to another aspect of the embodiments, the clock generating circuit may include a switching circuit that switches a power supply provided to another circuit in response to the first control signal.

According to another aspect of the embodiments, the clock generating circuit may include a second control circuit A second control circuit may provide an activation signal having an activation logic level and a deactivation logic level. The first and second measuring circuits may be disabled when the activation signal has the deactivation logic level.

According to another aspect of the embodiments, the activation signal may have the deactivation logic level for a predetermined time period after a power supply is turned on.

According to another aspect of the embodiments, the predetermined time period that the activation signal has the deactivation logic level after a power supply is turned on may be provided by a time constant circuit.

According to another aspect of the embodiments, the clock generating circuit may include a switching circuit. The switching circuit may switch a power supply that is provided to the oscillation circuit after a predetermined time period from a power supply being turned on.

According to another aspect of the embodiments, the predetermined time period from a power supply being turned on may be provided by a time constant circuit.

According to another aspect of the embodiments, the predetermined time period from a power supply being turned on may be provided by a counter circuit. The counter circuit may count a first clock signal to a predetermined value.

According to another aspect of the embodiments, a switching circuit that switches a power supply that is provided to the another circuit after a predetermined time period from a power supply being turned on.

According to another aspect of the embodiments, a clock generating method may include the steps of generating an original clock signal with an oscillation circuit, charging a charge node when the original clock signal reaches at least a predetermined magnitude, generating a control signal having a first logic level in an initial state and may become a second logic level when the charge node reaches a predetermined potential, providing a synthesized clock signal in response to the control signal and the original clock signal.

According to another aspect of the embodiments, the clock generating method may include the step of switching a power supply that is provided to the another circuit than the oscillating circuit in response to the control signal.

According to another aspect of the embodiments, a clock generating method may include the steps of generating an original clock signal with an oscillation circuit, measuring a first time period in which the original clock signal is at least a first threshold value, measuring a second time period in which the original clock signal is at most a second threshold value, generating a control signal having a first logic level in an initial state and may become a second logic level when the first time period is essentially equal to the second time period, providing a synthesized clock signal in response to the control signal and the original clock signal.

According to another aspect of the embodiments, the system may further include a second SDRAM and the method may include the steps of determining whether a second power supply provided to the second SDRAM is to be turned off or kept on in accordance with whether data stored in the second SDRAM is necessary or unnecessary, and turning off the second power supply provided to the second SDRAM if the step of determining determines that the data stored in the second SDRAM is unnecessary.

According to another aspect of the embodiments, the method may include the step of providing a second power supply status indication to the SDRAM controller after determining whether the second power supply provided to the second SDRAM is to be turned on or kept off.

According to another aspect of the embodiments, a clock generating method may include the step of switching a power supply that is provided to the oscillating circuit in response to the control signal.

According to another aspect of the embodiments, a clock generating method may include disabling the first measuring step and the second measuring step.

According to another aspect of the embodiments, the step of disabling the first measuring step and the second measuring step may be performed in response to the first control signal transitioning to the second logic level.

According to another aspect of the embodiments, the step of disabling the first measuring step and the second measuring step may be performed for a predetermined time period after a power supply is turned on.

According to another aspect of the embodiments, the predetermined time period that the first measuring step and the second measuring step are disabled after a power supply is turned on may be provided by a time constant circuit.

According to another aspect of the embodiments, a clock generating method may include the step of switching a power supply that is provided to the oscillation circuit after a predetermined time period from a power supply being turned on.

According to another aspect of the embodiments, the predetermined time period after a power supply is turned on may be determined by a time constant circuit.

According to another aspect of the embodiments, the predetermined time period that the first measuring step and the second measuring step are disabled after a power supply is turned on may be determined by a counter that counts a clock signal to a predetermined value.

According to another aspect of the embodiments, a clock generating method may include the step of switching a power supply that is provided to the another circuit after a predetermined time period from a power supply being turned on.

DETAILED DESCRIPTION OF THE EMBODIMENTS

Various embodiments of the present invention will now be described in detail with reference to a number of drawings.

Figure 1:
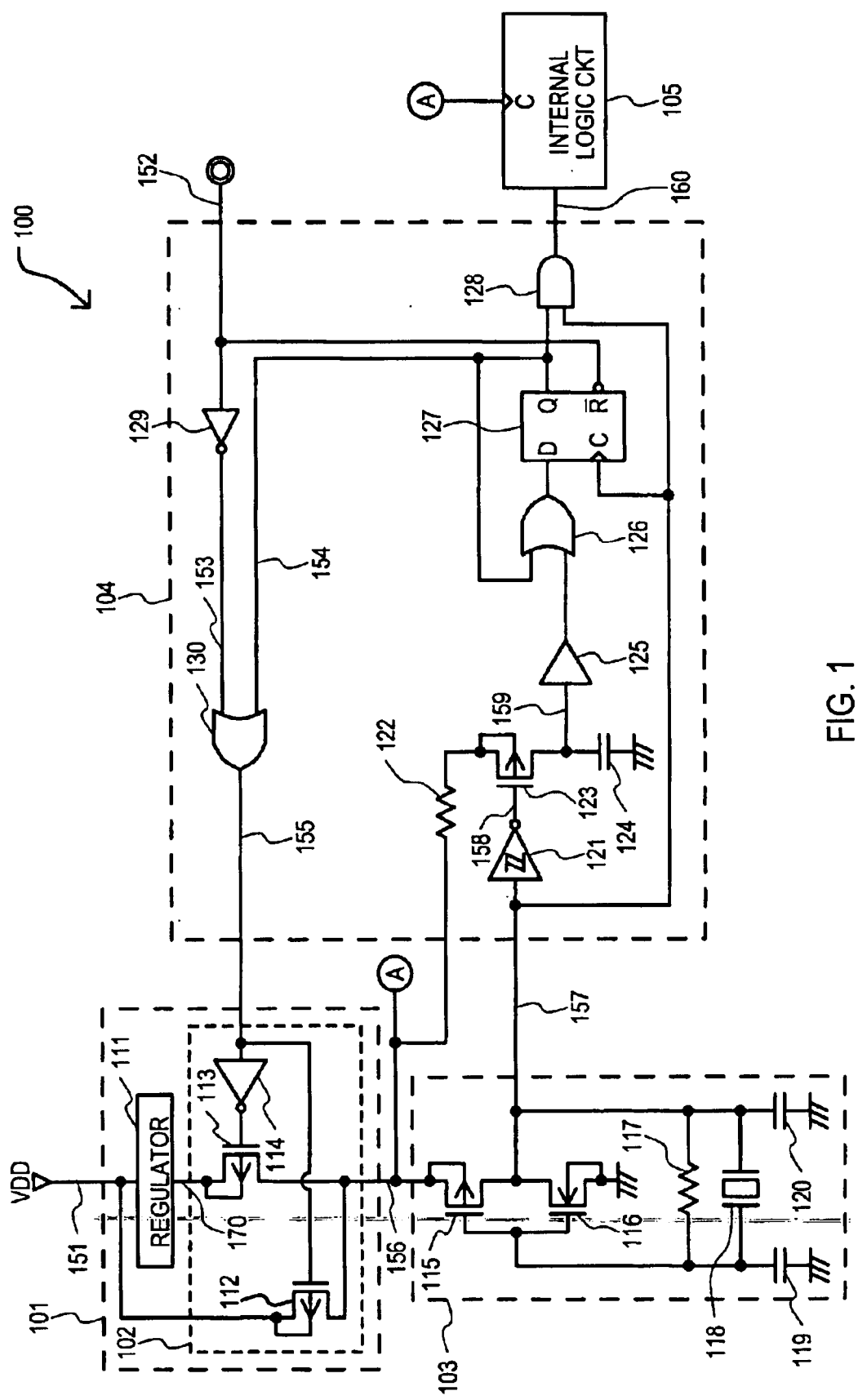
FIG. 1 is a circuit schematic diagram of a clock generating circuit according to an embodiment.

Referring now to FIG. 1, a circuit schematic diagram of a clock generating circuit according to an embodiment is set forth and given the general reference character 100.

Clock generating circuit 100 may include a variable voltage generating circuit 101, a quartz oscillating circuit 103, and a control circuit 104. Clock generating circuit 100 may provide a clock signal 160 to an internal logic circuit 105. Variable voltage generating circuit 101 may receive an external power supply voltage VDD and a power supply switch signal 155 (from control circuit 104) and may provide a variable power supply 156 to quartz oscillating circuit 103, control circuit 104, and internal logic circuit 105. Quartz oscillating circuit 103 may provide an original clock signal 157 to control circuit 104. Control circuit 104 may receive a reset signal 152, original clock signal 157, and variable power supply 156, and may provide a clock signal 160 to internal logic circuit 105.

Variable voltage generating circuit 101 may include a regulator circuit 111 and a switch circuit 102. Regulator circuit 111 may receive external power supply voltage VDD and may provide an essentially constant voltage 170. Switch circuit 102 may include p-type transistors (112 and 113) and an inverter 114. P-type transistors (112 and 113) may be p-type insulated gate field effect transistors (IGFETs), as just one example. P-type transistor 112 may have a source (and body) connected to external power supply voltage VDD, a gate connected to receive power supply switch signal 155, and a drain connected to variable power supply 156. P-type transistor 113 may have a source (and body) connected to essentially constant voltage 170, a gate connected to receive an output of inverter 114, and a drain connected to variable power supply 156. Inverter 114 may have an input connected to receive power supply switch signal 155.

Quartz oscillating circuit 103 may include a p-type transistor 115, an n-type transistor 116, a resistor 117, a quartz element 118, and capacitors (119 and 120). P-type transistor 115 may have a source (and body) connected to receive variable power supply 156, a drain connected to original clock signal 157, and a gate connected to a common terminal connection of resistor 117, capacitor 119, and quartz element 118. N-type transistor 116 may have a drain connected to original clock signal 157, a source (and body) connected to ground, and a gate connected to the common terminal connection 6f resistor 117, capacitor 119, quartz element 118, and gate of p-type transistor 115. Resistor 117 may have a first terminal connected to the gate of n-type transistor 116 and p-type transistor 115 and a second terminal connected to original clock signal 157. Quartz element 118 may have a first terminal connected to the gate of n-type transistor 116 and p-type transistor 115 and a second terminal connected to original clock signal 157. Capacitor 119 may have a first terminal connected to the gate of n-type transistor 116 and p-type transistor 115 and a second terminal connected to ground. Capacitor 120 may have a first terminal connected to original clock signal 157 and a second terminal connected to ground. N-type transistor 116 may be an n-type IGFET and p-type transistor 115 may be a p-type IGFET, as just two examples. P-type transistor 115 and n-type transistor 116 may form an inverter.

Control circuit 104 may include a Schmidt trigger inverter 121, a resistor 122, a p-type transistor 123, a capacitor 124, a buffer 125, an OR gate 126, a D-type flip-flop 127, an AND gate 128, an inverter 129, and an OR gate 130. Schmidt trigger inverter 121 may receive original clock signal 157 and provide a digital signal 158 to a gate of p-type transistor 123. Resistor 122 may have a first terminal connected to variable power supply 156 and a second terminal connected to a source (and body) of p-type transistor 123. P-type transistor 123 may have a drain connected to an input of buffer 125 and a first terminal of capacitor 124. Capacitor 124 may have a second terminal connected to ground. Buffer 125 may have an output connected to an input of OR gate 126. OR gate 126 may have an input connected to receive an output Q of D-type flip-flop 127 and an output connected to an input D of D-type flip-flop 127. D-type flip-flop 127 may have a clock input C connected to receive original clock signal 157 and a reset input/R connected to receive reset signal 152, and an output Q connected to an input of AND gate 128, an input of OR gate 126, and an input of OR gate 130. AND gate 128 may provide a clock signal 160 to internal logic circuit 105. Inverter 129 may receive reset signal 152 and provide an output to an input of OR gate 130. OR gate 130 may provide power supply switch signal 155 as an output. P-type transistor 123 may be a p-type IGFET, as just one example.

Quartz oscillating circuit 103 may be supplied with a variable power supply 156 provided from variable voltage generating circuit 101. The amplitude of original clock signal 157 may vary in accordance with a magnitude of the voltage of variable power supply 156 provided from variable voltage generating circuit 101.

Variable voltage generating circuit 101 may provide variable power supply 156 having essentially a voltage of external power supply voltage VDD when power supply switch signal 155 is a logic low level and a variable power supply 156 having essentially a voltage of essentially constant voltage 170 provided by voltage regulator 111 when power supply switch signal 155 is a logic high level. Essentially constant voltage 170 provided by voltage regulator 111 may be lower than external power supply voltage VDD.

In control circuit 104, capacitor 124 may be charged when the magnitude of original clock signal 157 reaches a high input voltage $V_H$ of Schmidt trigger inverter 121, so that digital signal 158 may become low. In this way, p-type transistor 123 may be turned on and variable power supply 156 may provide a charging current through resistor 122 and p-type transistor 123 to capacitor 124. When capacitor 124 is charged so that signal 159 becomes higher than a threshold value of buffer 125, buffer 125 may provide a logic high output as an input to OR gate 126. Thus, the output of OR gate 126 may become logic high. D-type flip-flop 127 may provide an oscillation stabilization signal 154 in response to the logic high output of OR gate 126 on the subsequent logic high value of original clock signal 157. In this way, AND gate 128 may be enabled to provide clock signal 160. Also, at this time, power supply switch signal 155 may transition to a logic low level and variable voltage generating circuit 101 may switch variable power supply 156 from an external power supply voltage VDD to essentially constant voltage 170 provided from voltage regulator 111.

Schmidt trigger inverter 121 may include hysteresis, such that, a high input voltage $V_H$ providing a switching from a high to low output level may be higher than a low input voltage $V_L$ providing a switching from a low to high output level. In this way, oscillations between a high input level $V_H$ and a low input level $V_L$ may be essentially ignored.

Figure 2:
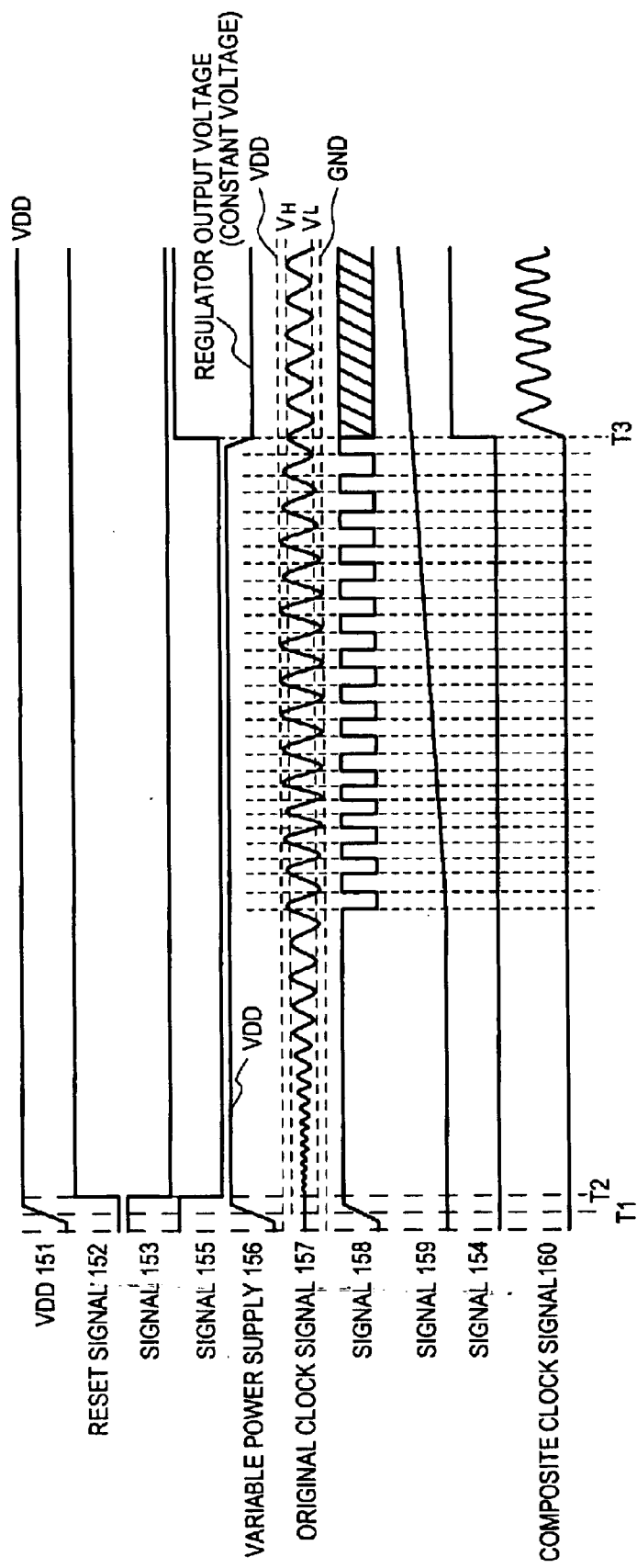
FIG. 2 is a timing diagram illustrating the operation of clock generating circuit of FIG. 1 upon a power up and a reset according to an embodiment.

The operation of clock generating circuit 100 will now be described with reference to a timing diagram of FIG. 2 in conjunction with FIG. 1. FIG. 2 is a timing diagram illustrating the operation of clock generating circuit 100 upon a power up and a reset.

At time T1, external power supply terminal 151 may rise to an external power supply voltage VDD. At this time, because reset signal 152 is low, D-type flip-flop 127 may have an output Q reset and oscillation stabilization signal 154 may be set to a low level. After turning on the power supply (time T1), a reset may be cancelled (time T2) and reset signal may transition from a low level to a high level. With reset signal 152 high, the output signal 153 of inverter 129 may be low. With output signal 153 of inverter 129 low and oscillation stabilization signal 154 low, OR gate 130 may provide a power supply switch signal 155 having a logic low level. With power supply switch signal 155 low, p-type transistor 112 may be turned on and p-type transistor 113 may be turned off (through inverter 114). With p-type transistor 112 turned on, external power supply voltage VDD may be provided to variable power supply 156. At this time, quartz oscillating circuit 103 may receive external power supply voltage VDD and may begin to oscillate and original clock signal 157 may grow.

Schmidt trigger buffer 121 may receive original clock signal 157 as an analog signal and may provide digital signal 158 as an output.

After original clock signal 157 grows to a signal that has a minimum level under low input level $V_L$ of Schmidt trigger buffer 121 and a maximum level over high input level $V_H$ of Schmidt trigger buffer 121, digital signal 158 may oscillate between a high and a low level in accordance with original clock signal 157. In this way, p-type transistor 123 may turn on and off in accordance with a low level and high level, respectively, of digital signal 158. In this way, when p-type transistor 123 is turned on, capacitor 124 may be charged. At time T3, the voltage on capacitor 124 may provide a signal 159 having a threshold value $V_{IH}$ of buffer 125 and buffer 125 may provide a high output level. This high level may be latched (through OR gate 126) by D-flip-flop 127 to provide an oscillation stabilization detection signal 154 having a high level.

The value of capacitor 124 and resistor 122 and the threshold value $V_{IH}$ of buffer 125 may be appropriately set in accordance with characteristics of quartz element 118 (a quartz operating element). In this way, oscillation stabilization signal 159 may be maintained at a low level until quartz oscillating circuit 103 is stabilized.

At time T3, when oscillation stabilization detection signal 154 becomes a high level, power supply switch signal 155 may become high. With power supply switch signal 155 high, p-type transistor 112 may be turned off and p-type transistor 113 may be turned on (through inverter 114). With p-type transistor 113 turned on, essentially constant power supply voltage 170 may be provided to variable power supply 156. In this way, quartz oscillating circuit 103 and internal logic circuit 105 may have a decreased power consumption.

Because oscillation stabilization detection signal 154 is high, AND gate 128 may be enabled and may provide clock signal 160 (a synthesized clock signal) to internal logic circuit 105. In this way, an incorrect clock signal may be prevented from being supplied to internal logic circuit 105.

Figure 3:
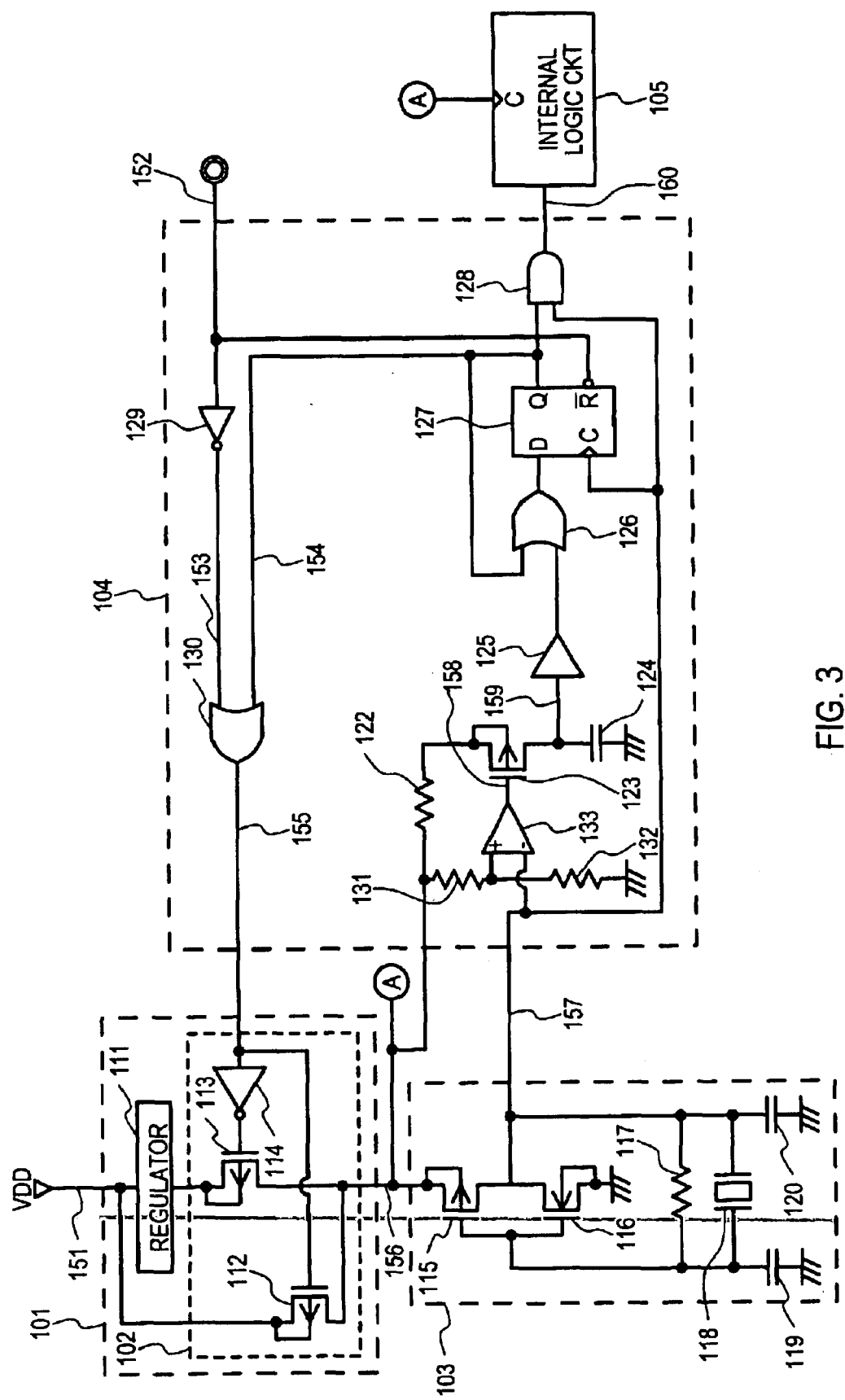
FIG. 3 is a circuit schematic diagram of a clock generating circuit according to an embodiment.

Referring now to FIG. 3, a circuit schematic diagram of a clock generating circuit according to an embodiment is set forth and given the general reference character 300.

Clock generating circuit 300 may include similar constituents as clock generating circuit 100. Such constituents may be referred to by the same reference character and description may be omitted.

Clock generating circuit 300 may differ from clock generating circuit 100 in that Schmidt trigger inverter 121 may be replaced by resistors (131 and 132) and comparator 133. Resistor 131 may have a first terminal connected to variable power supply 156 and a second terminal connected to a positive input terminal of comparator 133. Resistor 132 may have a first terminal connected to a positive input terminal of comparator 133 and a second terminal connected to ground. Comparator 133 may have a negative terminal connected to receive original clock signal 157 and an output terminal connected to a gate of p-type transistor 123.

A reference voltage may be provided to the positive input terminal of comparator 133 by dividing the voltage of variable power supply 156 using resistors (131 and 132). When original clock signal 157 has a voltage exceeding the reference voltage, output signal 158 of comparator 133 may be low and p-type transistor 123 may be turned on. In this way, capacitor 124 may be charged. When original clock signal 157 does not have a voltage exceeding the reference voltage, output signal 158 of comparator 133 may be high and p-type transistor 123 may be turned off.

Clock generating circuit 300 may operate generally in the same way as clock generating circuit 100 and the description is omitted.

Figure 4:
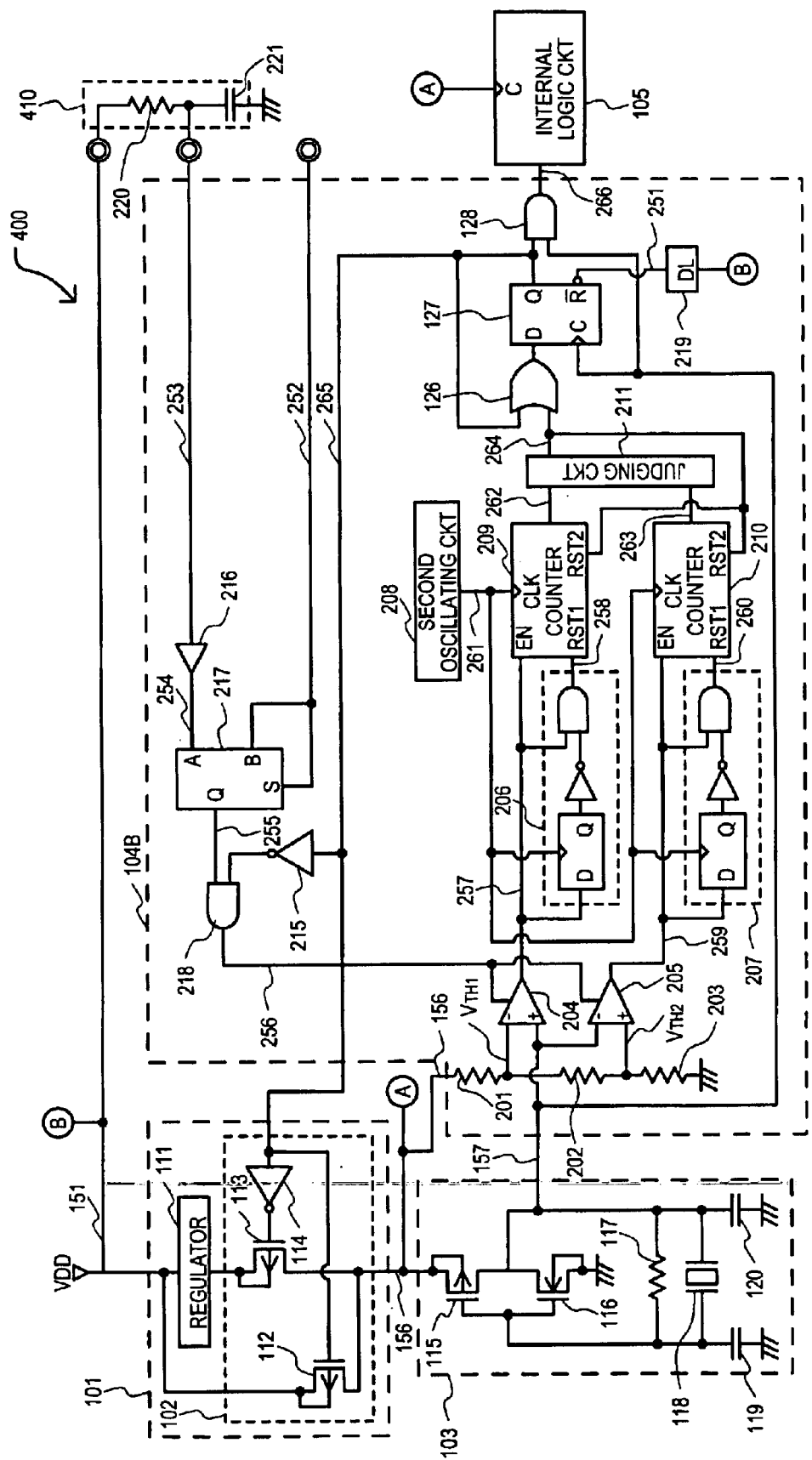
FIG. 4 is a circuit schematic diagram of a clock generating circuit according to an embodiment.

Referring now to FIG. 4, a circuit schematic diagram of a clock generating circuit according to an embodiment is set forth and given the general reference character 400.

Clock generating circuit 400 may include similar constituents as clock generating circuit 100. Such constituents may be referred to by the same reference characters and their description may be omitted.

Clock generating circuit 400 may differ from clock generating circuit 100 in that control circuit 104 may be replaced with a control circuit 104B.

Control circuit 104B may include resistors (201, 202, and 203), comparators (204 and 205), rising edge detecting circuits (206 and 207), a second oscillating circuit 208, counters (209 and 210), judging circuit 211, OR gate 126, D-type flip-flop 127, AND gate 128, buffer 216, selector 217, inverter 215, AND gate 218, and delay circuit 219.

Resistor 201 may have a first terminal connected to variable power supply 156 and a second terminal connected to a negative input of comparator 204. Resistor 202 may have a first terminal connected to a negative input of comparator 204 and a second terminal connected to a positive input of comparator 205. Resistor 203 may have a first terminal connected to a positive input of comparator 205 and a second terminal connected to ground. In this way, resistors (201 to 203) may form a voltage divider circuit and a threshold voltage $V_{TH1}$ may be provided to a negative input of comparator 204 at a connection node of resistors (201 and 202) and a threshold voltage $V_{TH2}$ may be provided to a positive input of comparator 205 at a connection node of resistors (202 and 203). Threshold voltage $V_{TH1}$ may be higher than threshold voltage $V_{TH2}$.

Comparator 204 may have a positive input connected to receive original clock signal 157 and may provide a digital signal 257 as an input to rising edge detector 206 and an enable input EN to counter 209. Comparator 205 may have a negative input connected to receive original clock signal 157 and may provide a digital signal 259 as an input to rising edge detector 207 and an enable input EN to counter 210. Comparators (204 and 205) may receive a drive signal 256 as a supply voltage.

Rising edge detecting circuit 206 may receive digital signal 257 and a second clock signal 261 as inputs and may provides a signal 258 as a reset signal to counter 209. Rising edge detecting circuit 206 may detect the rising edge of digital signal 257 and may provide signal 258 having a high level in response thereto. Rising edge detecting circuit 207 may receive digital signal 259 and second clock signal 261 as inputs and may provides a signal 260 as a reset signal to counter 210. Rising edge detecting circuit 207 may detect the rising edge of digital signal 259 and may provide signal 260 having a high level in response thereto.

Second oscillating circuit 208 may provide second clock signal 261. Second clock signal 261 may have a frequency that is about several times higher to several tens higher than the frequency of original clock signal 157 provided by quartz oscillating circuit 103. Second oscillating circuit 208 may be a ring oscillator, as just one example.

Counter 209 may receive second clock signal 261 and digital signal 257. Counter 209 may count up in response to second clock signal 261 when digital signal 257 is high. Counter 209 may also receive signal 258 from rising edge detecting circuit 206 and signal 264 from judging circuit 211 as a first reset signal RST1 and second reset signal RST2, respectively. Counter 209 may provide count value 262 as an input to judging circuit 211. Counter 210 may receive second clock signal 261 and digital signal 259. Counter 210 may count up in response to second clock signal 261 when digital signal 259 is high. Counter 210 may also receive signal 260 from rising edge detecting circuit 207 and signal 264 from judging circuit 211 as a first reset signal RST1 and second reset signal RST2, respectively. Counter 210 may provide count value 263 as an input to judging circuit 211.

Judging circuit 211 may provide signal 264 as a high level when count value 262 and count value 263 are 1 or higher and coincide with each other.

In clock generating circuit 400, OR gate 126, D-type flip-flop 127, and AND gate 128 may be configured essentially the same as in clock generating circuit 100. However, in clock generating circuit 400, D-type flip-flop 127 may receive a signal 251 from a delay circuit 219 at a reset terminal/R. Signal 251 may be generated by delaying external power supply voltage VDD by delay circuit 219. AND gate 128 may provide a clock signal 266 (a synthesized clock signal) to internal logic circuit 105.

Inverter 215 may receive an oscillation stabilization detection signal 265 provided by D-type flip-flop circuit 127 and may provide an output as an input to AND gate 218. In clock generating circuit 400, oscillation stabilization detection signal 265 may be provided directly to variable voltage generating circuit 101 as a power supply switch signal.

Resistor 220 and capacitor 221 may form a time constant circuit 410. Resistor 219 may have a first terminal connected to an external power supply terminal 151 and may receive an external power supply voltage VDD and may have another terminal connected to a terminal of capacitor 221 to provide a time constant signal 253. Capacitor 221 may have another terminal connected to ground.

Buffer 216 may have an input connected to receive time constant signal 253 and provide an output signal 254 as an input A to selector circuit 217.

Selector circuit 217 may receive a select signal 252 at an input B and at a selection control input S and may provide an output Q as a signal 255. Signal 255 may be received as an input to AND gate 218. Selector 217 may select signal 254 to provide signal 255 when select signal 252 is at a low level and may select the select signal 252 to provide signal 255 when select signal 252 is at a high level.

AND gate 218 may provide drive signal 256 as a supply voltage to comparators (204 and 205). Comparators (204 and 205) may only operate when drive signal 256 is at a high level and may not operate when drive signal 256 is at a low level. When drive signal 256 is at a low level, digital signals (257 and 259) may be low.

The operation of clock generating circuit 400 may differ between a case where select signal 252 is high and a case where select signal 252 is low.

Figure 5:
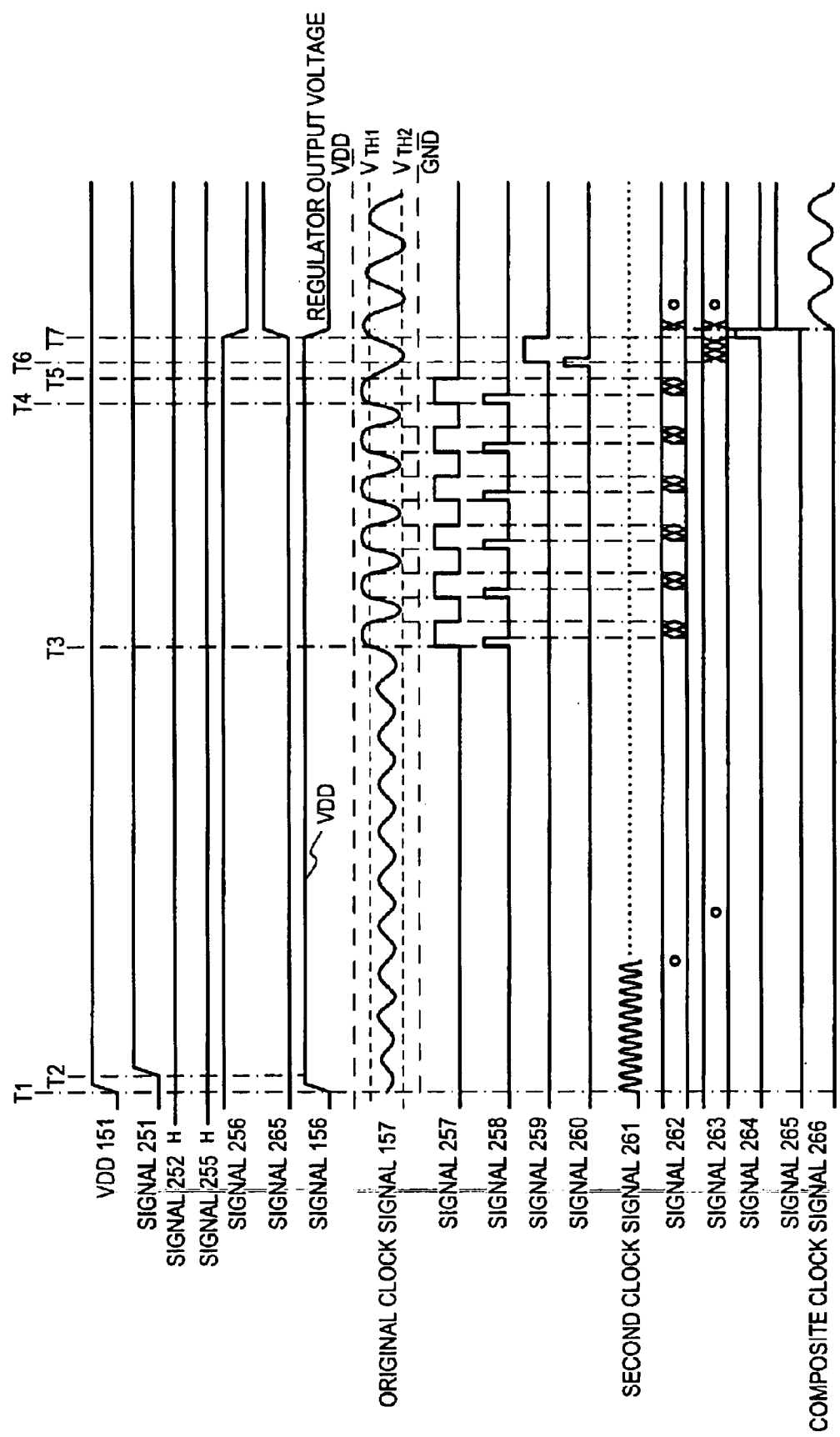
FIG. 5 is a timing diagram illustrating the operation of clock generating circuit of FIG. 4 upon a power up according to an embodiment.

FIG. 5 is a timing diagram illustrating the operation of clock generating circuit 400 upon a power up when select signal 252 is high.

Referring now to FIG. 5 in conjunction with FIG. 4, at time T1, external power supply VDD may be turned on and transition to a high level. At this time, quartz oscillating circuit 103 and second oscillating circuit 208 may begin to oscillate.

From time T1 to T2, delay circuit 219 may provide a signal 251 having a logic low to reset terminal/R of D-type flip-flop 127. In this way, D-type flip-flop 127 may be reset and oscillation stabilization detection signal 265 may be set to a low level. With oscillation stabilization detection signal 265 low, inverter 215 may provide a high level as an input to AND gate 218. With select signal 252 high, selector 217 may provide a high level as an input to AND gate 218. With both inputs of AND gate 218 high, AND gate 218 may provide a drive signal 256 having a high level. With drive signal 256 having a high level, comparators (204 and 205) may be enabled.

At time T2, delay circuit 219 may provide a logic high to signal 251 in response to external power supply VDD turning on.

From a period of time T1 to time T3, the amplitude of original clock signal 157 may be insufficient (lower than threshold voltage $V_{TH1}$ and higher than threshold voltage $V_{TH2}$) for either comparator (204 or 205) to provide a digital signal (257 or 259) having a logic high level.

At time T3, original clock signal 157 may have a sufficient amplitude and comparator 204 may provide a digital signal 257 that may periodically become high when the potential of clock signal becomes higher than threshold voltage $V_{TH1}$. However, at this time original clock signal 157 may have an insufficient amplitude with respect to threshold voltage $V_{TH2}$ (i.e. higher than threshold voltage $V_{TH2}$). Thus, digital signal 259 may remain low during this time period.

In time periods (T4 to T7) the amplitude of original clock signal 157 may be sufficient with respect to both the upper threshold voltage $V_{TH1}$ and the lower threshold voltage $V_{TH2}$. The amplitude of original clock signal 157 may be greater than threshold voltage $V_{TH1}$ from time T4 to time T5. Thus, digital signal 257 may become high at this time period. The amplitude of original clock signal 157 may be lower than threshold voltage $V_{TH2}$ from time T6 to time T7. Thus, digital signal 259 may become high at this time period.

At time T7, the count value 264 of counter 209 and the count value 263 of counter 210 may be greater than zero and may coincide with each other. At this time, judging circuit 211 may provide a signal 264 having a high level (indicating a match). OR gate 126 may provide a high level as an input D to D-type flip-flop 127, and D-type flip-flop 127 may provide oscillation stabilization detection signal 265 having a high level. OR gate 126 may receive oscillation stabilization detection signal 265 as an input to provide a latching feedback to D-type flip-flop 127. Signal 264 may be applied to reset terminals RST2 of counters (209 and 210). In this way, at time 17, the count values (262 and 263) of counters (209 and 210) may be reset.

With oscillation stabilization detection signal 265 high, variable voltage generating circuit 101 may switch from providing external power supply voltage VDD to supplying an essentially constant voltage from voltage regulator 111 as variable power supply 156 to quartz oscillating circuit 103 and internal logic circuit 103. With oscillation stabilization detection signal 265 high, inverter 215 may provide a logic low to AND gate 218. With a low input, AND gate 218 may provide a drive signal 256 having a low level. Thus, comparators (204 and 205) may be disabled. In this way, current consumption may be reduced.

With oscillation stabilization detection signal 265 high, AND gate 128 may provide synthesized clock signal 266 to internal logic circuit 105. In this way, an incorrect clock signal may be prevented from being supplied to internal logic circuit 105.

The operation of clock generating circuit 400 when select signal 252 is at a low level will now be described.

When select signal 252 is low, selector 217 may provide time constant signal 253 provided by time constant circuit 410 through buffer 216 as signal 255 to an input of AND gate 218. Therefore, upon a power-up operation, signal 255 may remain low until time constant signal 253 reaches a threshold value of buffer 216. With signal 255 low, AND 218 may provide drive signal 256 having a low level. With drive signal 256 low, comparators (204 and 205) may be disabled. Time constant signal 253 may rise in accordance with the values of resistor 220 and capacitor 221 in time constant circuit 410.

If time constant signal 253 reaches a threshold value of buffer 216 before time T4 (FIG. 5), then oscillation stabilization detection signal 265 may switch from low to high at time T7 and the basic operation of clock generating circuit 400 is essentially the same as a case in which select signal 252 is high as illustrated in FIG. 5.

Figure 17:
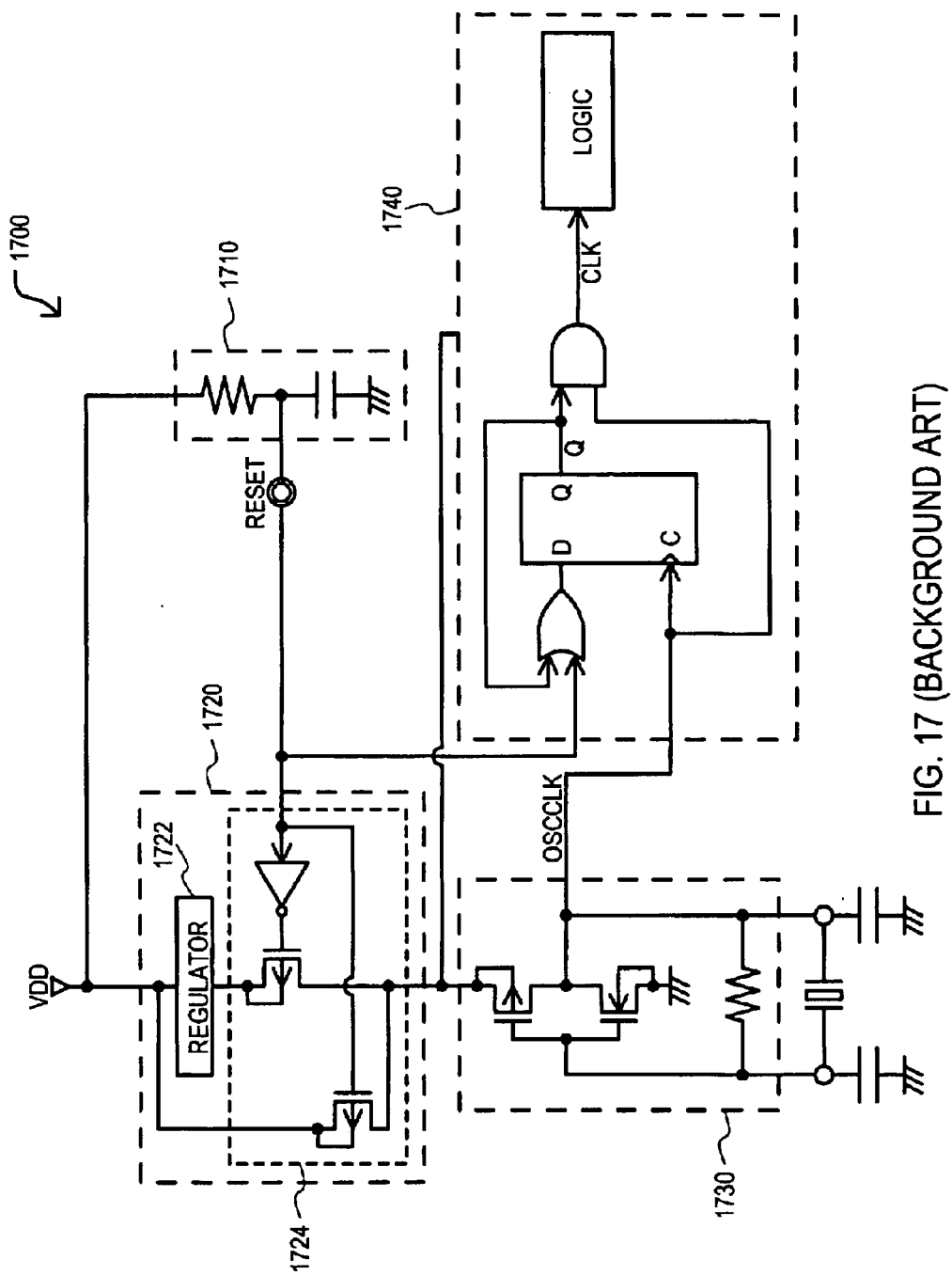
FIG. 17 is a circuit schematic diagram of a conventional clock generating circuit.
Figure 18:
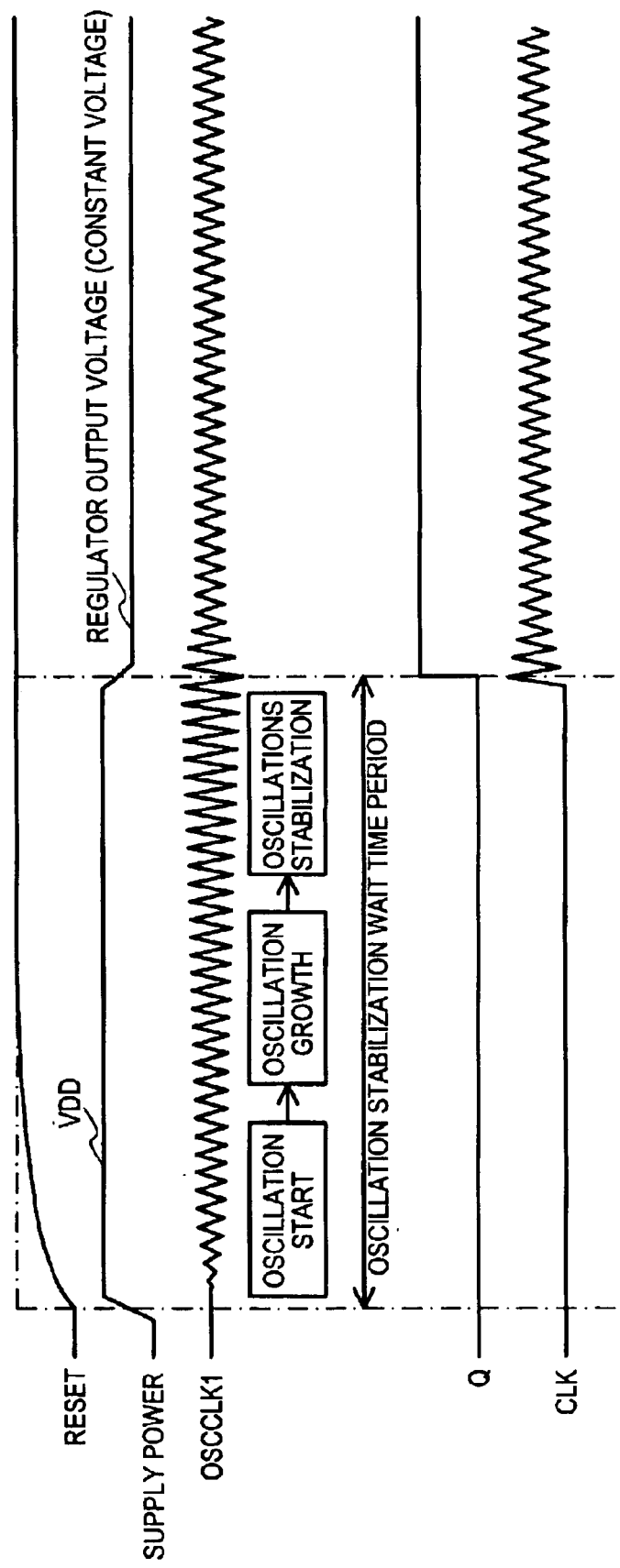
FIG. 18 is a timing diagram showing the operation of conventional clock generating circuit of FIG. 17 after a reset.

In a conventional approach, such as conventional clock generating circuit 1700 illustrated in FIG. 17, a time constant circuit may be used to provide the power supply switch signal and an enable signal to generate a clock signal based on an oscillating signal. However, if the time constant signal generated with the conventional approach is not sufficiently long, the power supply voltages to the oscillating circuit and the internal logic circuit are switched before the oscillating circuit providing the oscillating signal is stabilized.

In clock generating circuit 400 according to an embodiment, time constant circuit 410 may be provided to provide compatibility with a conventional approach. However, in clock generating circuit 400, even if time constant signal 253 rises too quickly due to, for example, an error by a designer, the generation of synthesized clock signal 266 and switching of power supply voltages may be prevented from occurring before quartz oscillating circuit 103 becomes stabilized.

When time constant signal 253 provided by time constant circuit 410 exceeds a threshold value of buffer 216 after time T4 (FIG. 5), comparators (204 and 205) may be enabled at this time. With comparators (204 and 205) enabled, oscillation stabilization detection signal 265 may become high shortly thereafter in response to counters (209 and 210) providing matching count values (262 and 263) because the quartz oscillation circuit 103 may already be stable at this time. In this way, a synthesized clock signal 266 may be generated.

Therefore, when a time constant of time constant circuit 410 is insufficient, switching of a power supply voltage level and generation of a synthesized clock signal may be delayed by oscillation stabilization verification circuitry in a control circuit. However, when a time constant of time constant circuit 410 is sufficient, the timing of switching of a power supply voltage level and generation of a synthesized clock signal may be conducted in accordance with a timing set by the time constant. In this way, substantial compatibility with a conventional clock generation circuit may be maintained while improper operation may be prevented.

Figure 6:
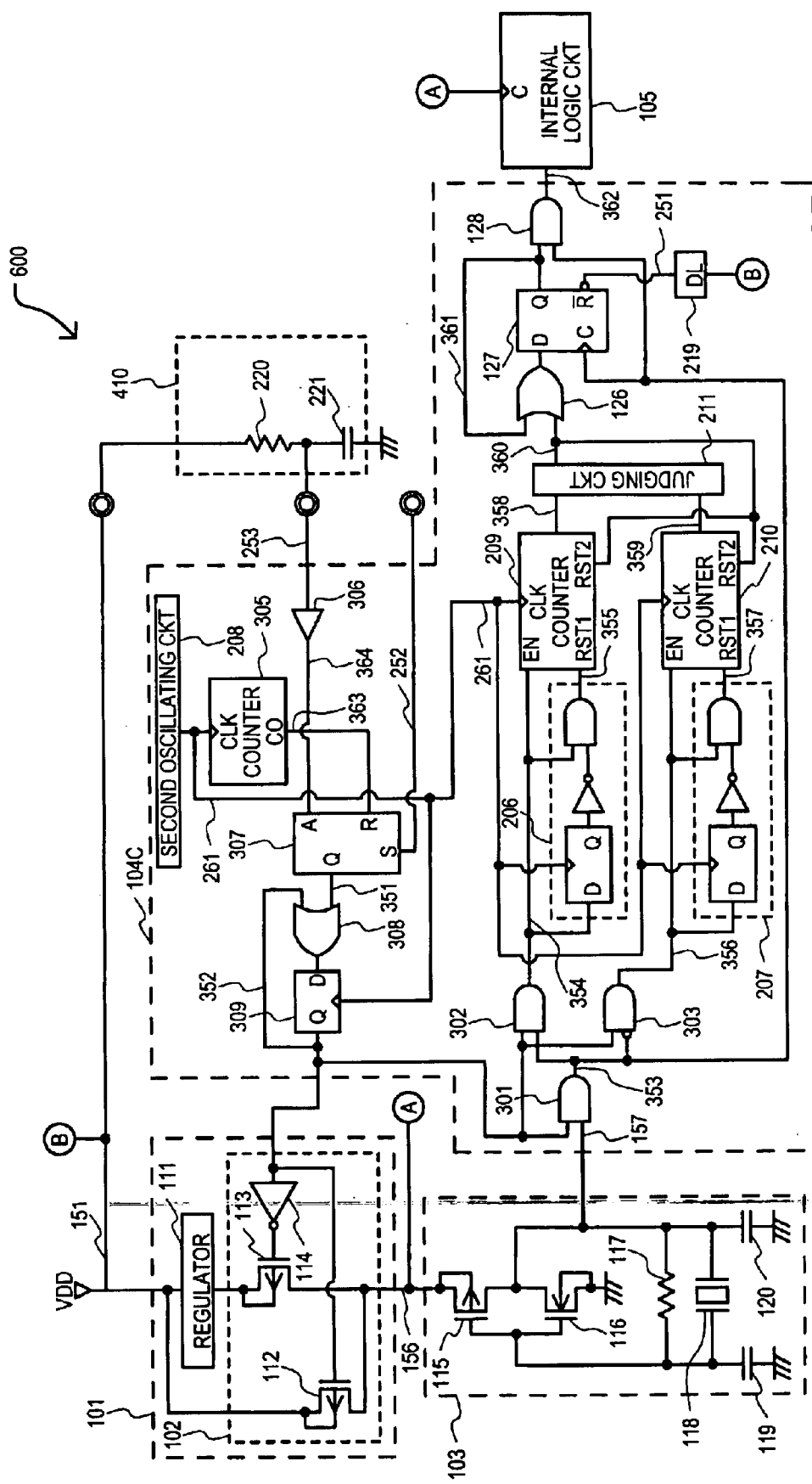
FIG. 6 is a circuit schematic diagram of a clock generating circuit according to an embodiment.

Referring now to FIG. 6, a circuit schematic diagram of a clock generating circuit according to an embodiment is set forth and given the general reference character 600.

Clock generating circuit 600 may include similar constituents as clock generating circuit 400. Such constituents may be referred to by the same reference characters and their description may be omitted.

Clock generating circuit 600 may differ from clock generating circuit 400 in that control circuit 104B may be replaced with a control circuit 104C. Control circuit 104C may include similar constituents as control circuit 104B. Such constituents may be referred to by the same reference characters and their description may be omitted.

Control circuit 104C may receive an original clock signal 157 and a time constant signal from a time constant circuit 410 and may generate a synthesized clock signal 362 and a power supply switch signal 352.

Control circuit 104C may include AND gates (301, 302, and 303), rising edge detecting circuits (206 and 207), a second oscillating circuit 208, counters (209 and 210), a judging circuit 211, an OR gate 126, a D-type flip-flop 127, an AND gate 128, a buffer 306, a counter 305, a selector 307, an OR gate 308, and a D-type flip-flop 309.

Buffer 306 may be connected to receive a time constant signal from a time constant circuit 410.

AND gate 301 may receive power supply switch signal 352 and original clock signal 157 and may provide a signal 353 as an input to AND gate 302, an inverted input to AND gate 303, a clock C input to D-type flip-flop 127, and an input to AND gate 128. In this way, signal 353 may remain low in a period from a time where power supply VDD is turned on until variable voltage generating circuit 101 provides a voltage from voltage regulator 111 as a variable power supply 156 to quartz oscillating circuit 103 and internal logic circuit 105. Thus, after variable voltage generating circuit 101 switches a power supply to a lower voltage, the magnitude of original clock signal 157 must reach a threshold value of AND gate 301 in order for AND gate 301 to provide a signal 353 that oscillates accordingly. Therefore, if original clock signal 157 has not sufficiently grown even after the power supply switching, the logic level of signal 353 may remain low or high (at a constant logic level). In this way, an oscillation stabilization detection signal 361 may not be generated and erroneous synthesized clock signal 362 may not be provided to internal logic circuit 105.

AND gate 302 may receive power supply switch signal 352 at another input and may provide an output 354 to rising edge detecting circuit 206 and to an enable EN of counter 209. AND gate 303 may receive power supply switch signal 352 at another input and may provide an output 356 to rising edge detecting circuit 207 and to an enable EN of counter 210. By providing AND gates (302 and 303) with power supply switch signal 352, AND gates (302 and 303) may not be enabled until voltage generating circuit 101 switches a power supply to a lower voltage. In this way, power consumption may be reduced.

Rising edge detecting circuit 206 may provide an output 355 as a reset RST1 to counter 209. Rising edge detecting circuit 207 may provide an output 357 as a reset RST1 to counter 210.

Second oscillating circuit 208 may provide second clock signal 261. Second clock signal 261 may have a frequency that is about several times higher to several tens higher than the frequency of original clock signal 157 provided by quartz oscillating circuit 103. Second oscillating circuit 208 may be a ring oscillator, as just one example.

Counter 209 may receive second clock signal 261. Counter 209 may count up in response to second clock signal 261 when signal 354 is high. Counter 209 may also receive signal 355 from rising edge detecting circuit 206 and signal 360 from judging circuit 211 as a first reset signal RST1 and second reset signal RST2, respectively. Counter 209 may provide count value 358 as an input to judging circuit 211. Counter 210 may receive second clock signal 261 and signal 357. Counter 210 may count up in response to second clock signal 261 when signal 357 is high. Counter 210 may also receive signal 357 from rising edge detecting circuit 207 and signal 360 from judging circuit 211 as a first reset signal RST1 and second reset signal RST2, respectively. Counter 210 may provide count value 359 as an input to judging circuit 211.

Judging circuit 211 may provide signal 360 as a high level when count value 358 and count value 359 are 1 or higher and coincide with each other.

In clock generating circuit 600, OR gate 126, D-type flip-flop 127, AND gate 128, and delay circuit 219 may be configured essentially the same as in clock generating circuit 400. However, in clock generating circuit 600, D-type flip-flop 127 may provide an oscillation stabilization detection signal 361 that may not also function as a power supply switch signal. Also, AND gate 128 may receive signal 353 which may be a digital signal provided by AND gate 301 instead of original clock signal 157 directly.

Counter 305 may receive second clock signal 261 from second oscillating circuit 208 and may generate a carry out signal 363. Carry out signal 363 may become high when a count value corresponding to counts of second clock signal 261 by counter 305 becomes a predetermined value.

Resistor 220 and capacitor 221 may form a time constant circuit 410. Resistor 220 may have a first terminal connected to an external power supply terminal 151 and may receive an external power supply voltage VDD and may have another terminal connected to a terminal of capacitor 221 to provide a time constant signal 253. Capacitor 221 may have another terminal connected to ground.

Buffer 306 may have an input connected to receive time constant signal 253 and provide an output signal 364 as an input A to selector circuit 307.

Selector circuit 307 may receive a select signal 252 at a selection control input S and carry out signal 363 at an input R and may provide an output Q as a signal 351. Signal 351 may be received as an input to OR gate 308. Selector 307 may select signal 364 to provide signal 351 when select signal 252 is at a low level and may select carry out signal 363 to provide signal 351 when select signal 252 is at a high level.

OR gate 308 may receive signal 351 at one input and power supply switch signal 352 at another input and may provide an output as an input D to D-type flip-flop 309. D-type flip-flop 309 may receive second clock signal 261 at a clock input and may provide power supply switch signal 252. OR gate 308 and D-type flip-flop 309 may be configured to maintain power supply switch signal 352 after power supply switch signal 352 becomes a high level.

The operation of clock generating circuit 600 may differ between a case where select signal 252 is high and a case where select signal 252 is low.

Figure 7:
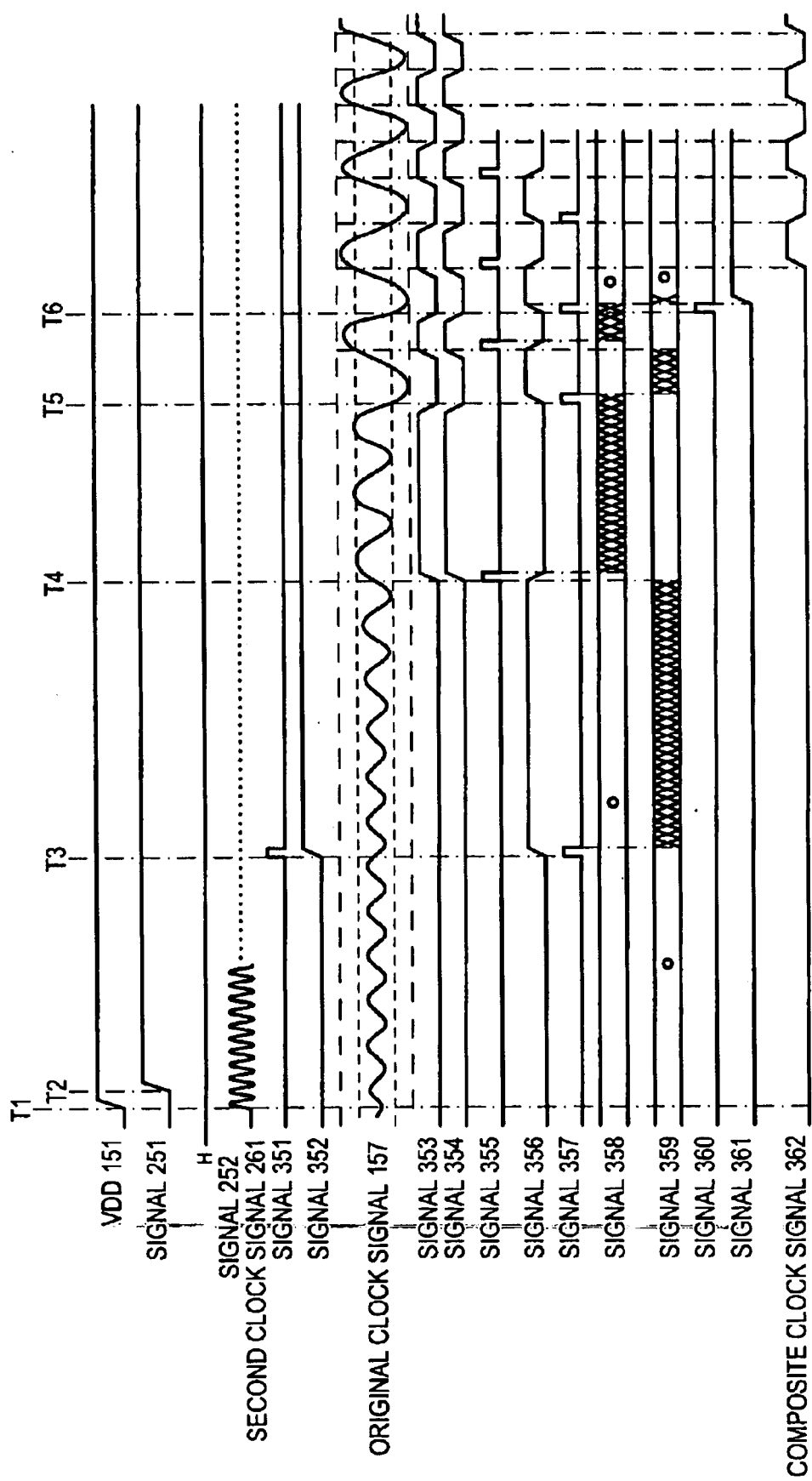
FIG. 7 is a timing diagram illustrating the operation of clock generating circuit of FIG. 6 upon a power up according to an embodiment.

FIG. 7 is a timing diagram illustrating the operation of clock generating circuit 600 upon a power up when select signal 252 is high.

Referring now to FIG. 7 in conjunction with FIG. 6, at time T1, external power supply VDD may be turned on and transition to a high level. At this time, quartz oscillating circuit 103 and second oscillating circuit 208 may begin to oscillate.

From time T1 to T2, delay circuit 219 may provide a signal 251 having a logic low to reset terminal/R of D-type flip-flop 127. In this way, D-type flip-flop 127 may be reset and oscillation stabilization detection signal 361 may be set to a low level.

Counter 305 may continuously conduct a count-up operation in response to second clock signal 261 and may provide a carry out signal 363 having a high level at time T3. With carry out signal 363 at a high level and select signal 252 high, selector 307 may provide a signal 351 having a high level. With signal 351 at a high level, OR gate 308 may provide a high output as an input D to D-type flip-flop 309 and D-type flip-flop may latch power supply switch signal 352 at a high level.

With power supply switch signal 352 high, variable voltage generating circuit 101 may switch from providing external power supply voltage VDD to supplying an essentially constant voltage from voltage regulator 111 as variable power supply 156 to quartz oscillating circuit 103 and internal logic circuit 103. With power supply switch signal 352 high, AND gates (301 to 303) may become enabled. At this time, either signal 356 or signal 354 may become a high level in response to a logic level of signal 353.

Counter (209 or 210) may respond to the rising of signal (354 or 356), respectively, by counting up to provide a count output (358 or 359). However, because only one of counters (209 or 210) counts, no match occurs and the output 360 of judging circuit may remain low.

From time T4 to time T5, the oscillation of original clock signal 157 may grow to some degree, yet may still not be sufficient to properly switch AND gate 301. FIG. 7 illustrates a case where original clock signal 157 may exceed a high input level $V_{IH}$ of AND gate 301, but may not go lower than a low input level $V_{IL}$ of AND gate 301. In this case, signal 353 provided by AND gate 301 may maintain a high level and only counter 209 may count up. Because only counter 209 counts up, and counter 210 does not, a match may not occur and oscillation stabilization detection signal 361 may remain low.

At time T5, original oscillation signal 157 may grow to be sufficient. In this situation, because the level of original clock signal 157 becomes periodically lower than a low input level $V_{IL}$ of AND gate 301 after reaching a high input level $V_{IH}$ of AND gate 301, signal 353 provided by AND gate 301 may periodically transition between a high level and a low level. In this case, counter 209 and counter 210 may alternately count up the same number of counts to provide count values (358 and 359), respectively, that may match or coincide.

At time T6, the count value 358 of counter 209 and the count value 359 of counter 210 may be greater than zero and may coincide with each other. At this time, judging circuit 211 may provide a signal 360 having a high level (indicating a match). OR gate 126 may provide a high level as an input D to D-type flip-flop 127 and D-type flip-flop 127 may provide oscillation stabilization detection signal 361 having a high level. OR gate 126 may receive oscillation stabilization detection signal 361 as an input to provide a latching feedback to D-type flip-flop 127. Signal 360 may be applied to reset terminals RST2 of counters (209 and 210). In this way, at time T6, the count values (358 and 359) of counters (209 and 210) may be reset.

With oscillation stabilization detection signal 361 high, AND gate 128 may provide synthesized clock signal 362 to internal logic circuit 105. In this way, an incorrect clock signal may be prevented from being supplied to internal logic circuit 105.

Accordingly, a synthesized clock signal 362 may be generated by providing an AND function of signal 353 and oscillation stabilization detection signal 361 using AND gate 128. However, a detection of original clock signal 157 for sufficiency may not occur until a counter 305 determines that a predetermined time period has elapsed from a turning on of a power supply VDD, so that original clock signal 157 may have sufficiently grown. When the oscillation of original clock signal 157 is not sufficient even after the predetermined time set by counter 305 from the time power supply VDD is turned on, synthesized clock signal 362 may be maintained at a low level.

When select signal 252 is low, a predetermined time period from the turning on of power supply VDD before checking original clock signal 157 for proper growth may be determined by time constant circuit 410. In this way, clock generating circuit 600 may maintain substantial compatibility with a conventional clock generating circuit However, in clock generating circuit 600, even if time constant signal 253 provided from time constant circuit 410 rises too quickly due to, for example, an error by a designer, the generation of synthesized clock signal 362 may be prevented from occurring before quartz oscillating circuit 103 becomes stabilized. This may be accomplished by fixing synthesized clock signal 362 at a low level. In this way, internal logic circuit 105 may be prevented from running out of control.

Also, when time constant circuit 410 provides a time constant that is set sufficiently long to allow growth of original clock signal 157 to become sufficient, synthesized clock signal 362 may be generated (oscillates between a low and high level) at the predetermined time set by time constant circuit 410.

Figure 8:
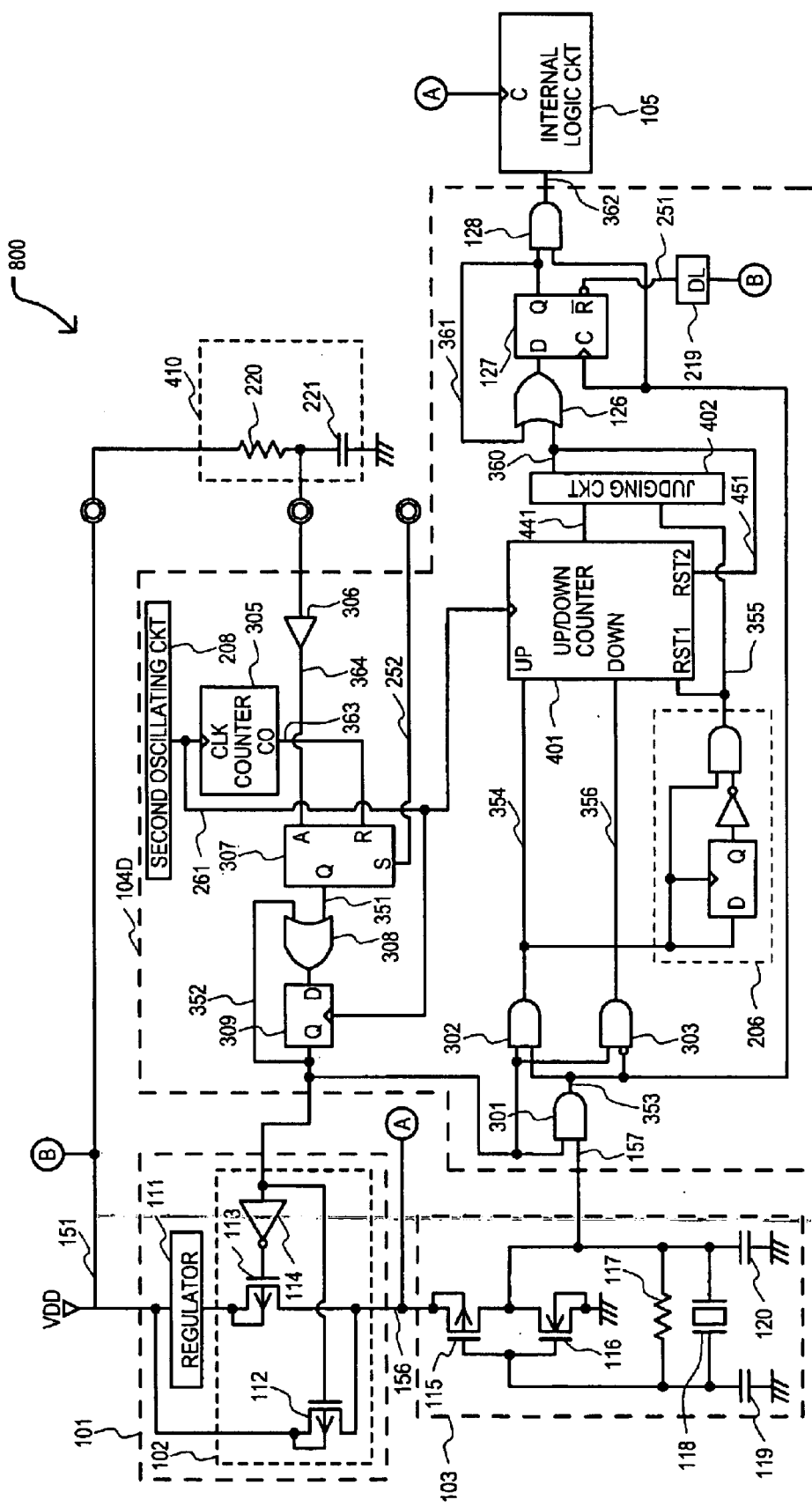
FIG. 8 is a circuit schematic diagram of a clock generating circuit according to an embodiment.
Figure 9:
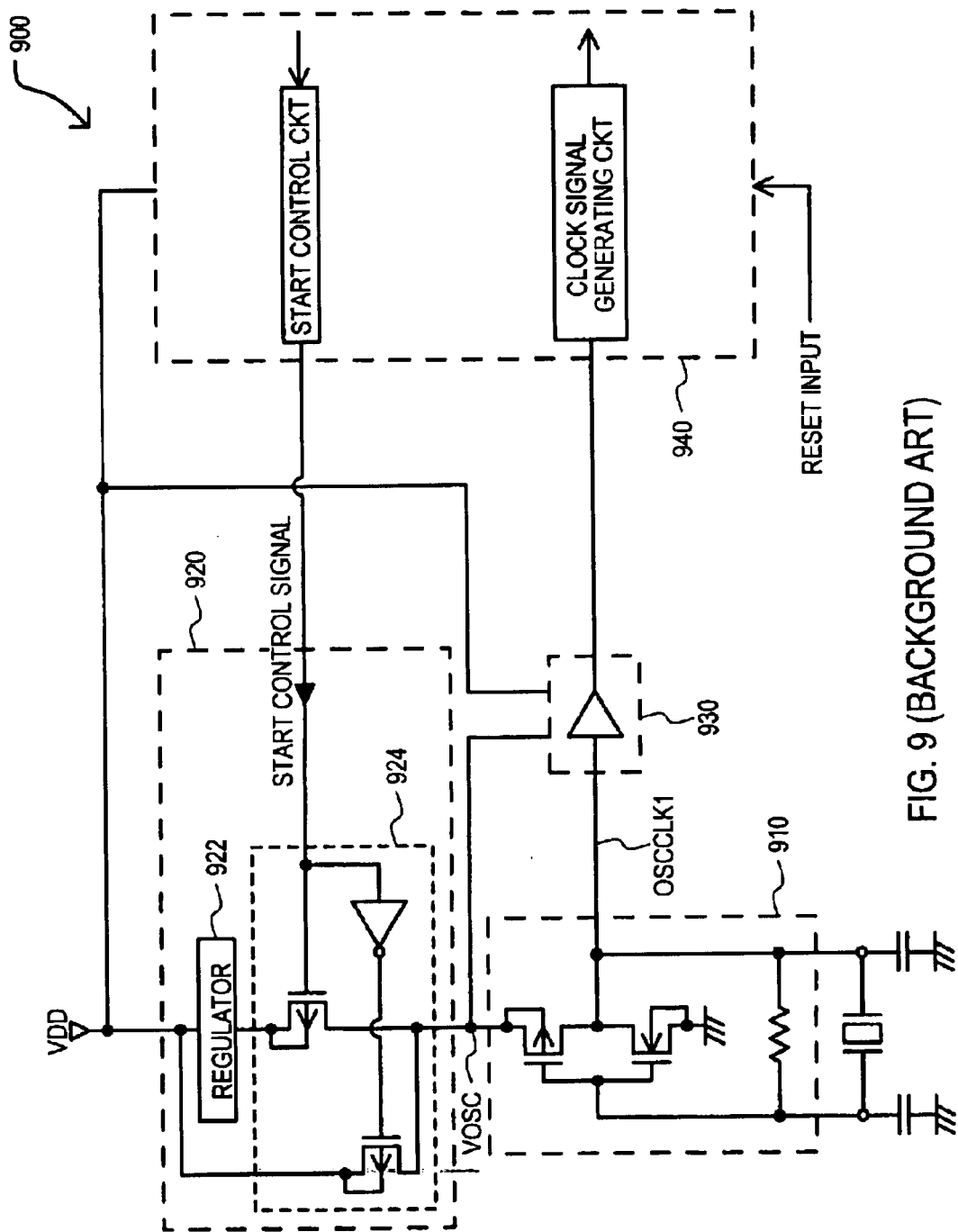
FIG. 9 is a circuit schematic diagram of a conventional clock generating circuit.
Figure 10:
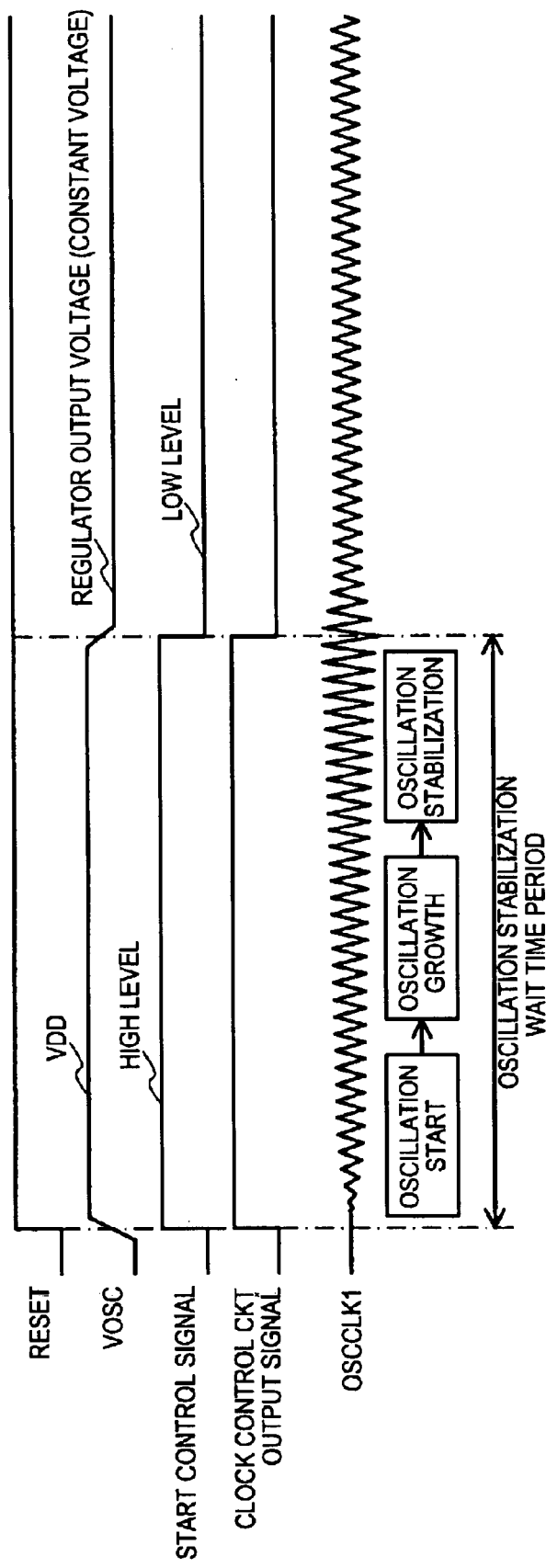
FIG. 10 is a timing diagram showing the operation of the conventional clock generating circuit of FIG. 9 in a power up.
Figure 11:
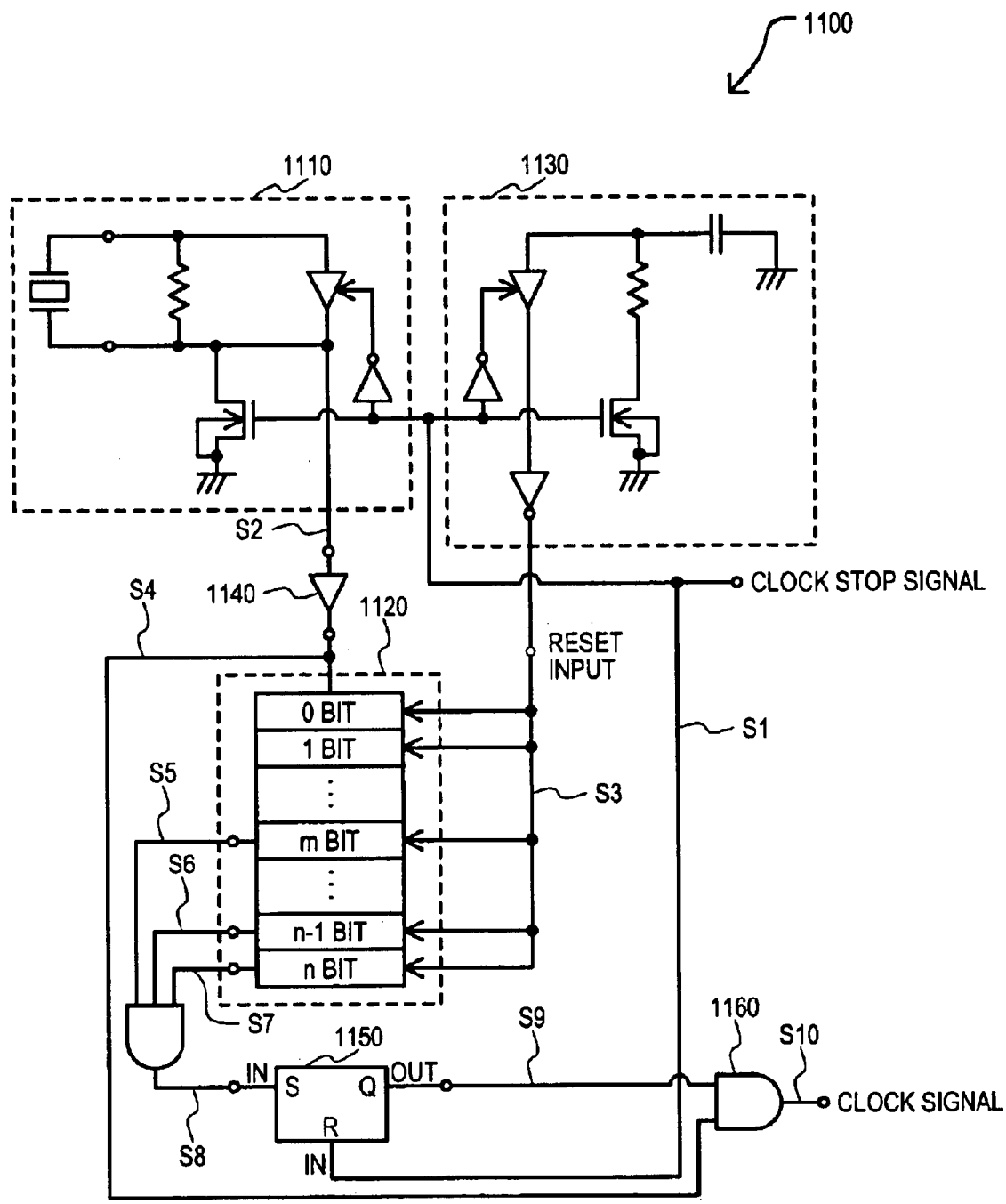
FIG. 11 is a circuit schematic diagram of a conventional clock generating circuit.
Figure 12:
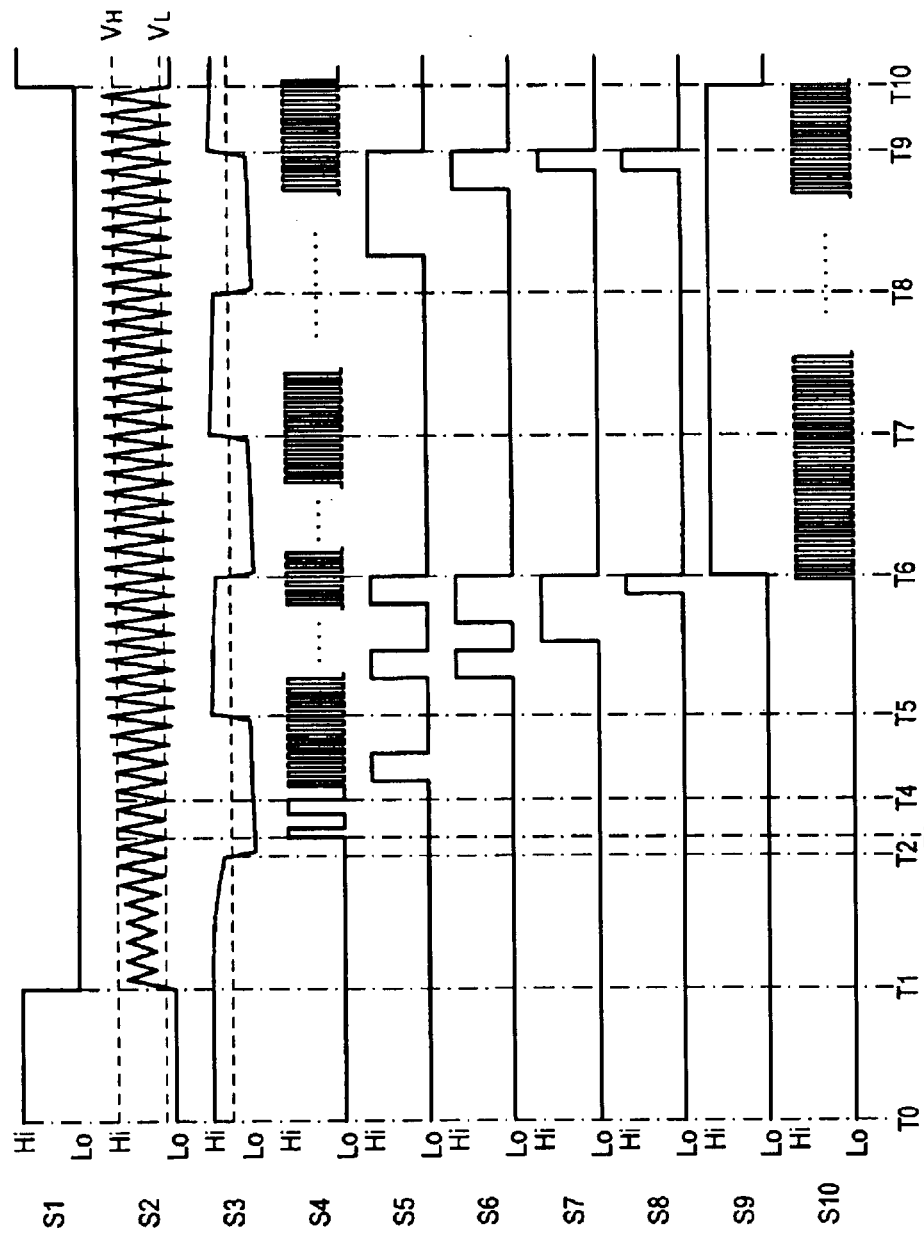
FIG. 12 is a timing diagram showing the operation of conventional clock generating circuit of FIG. 11 after a reset.
Figure 13:
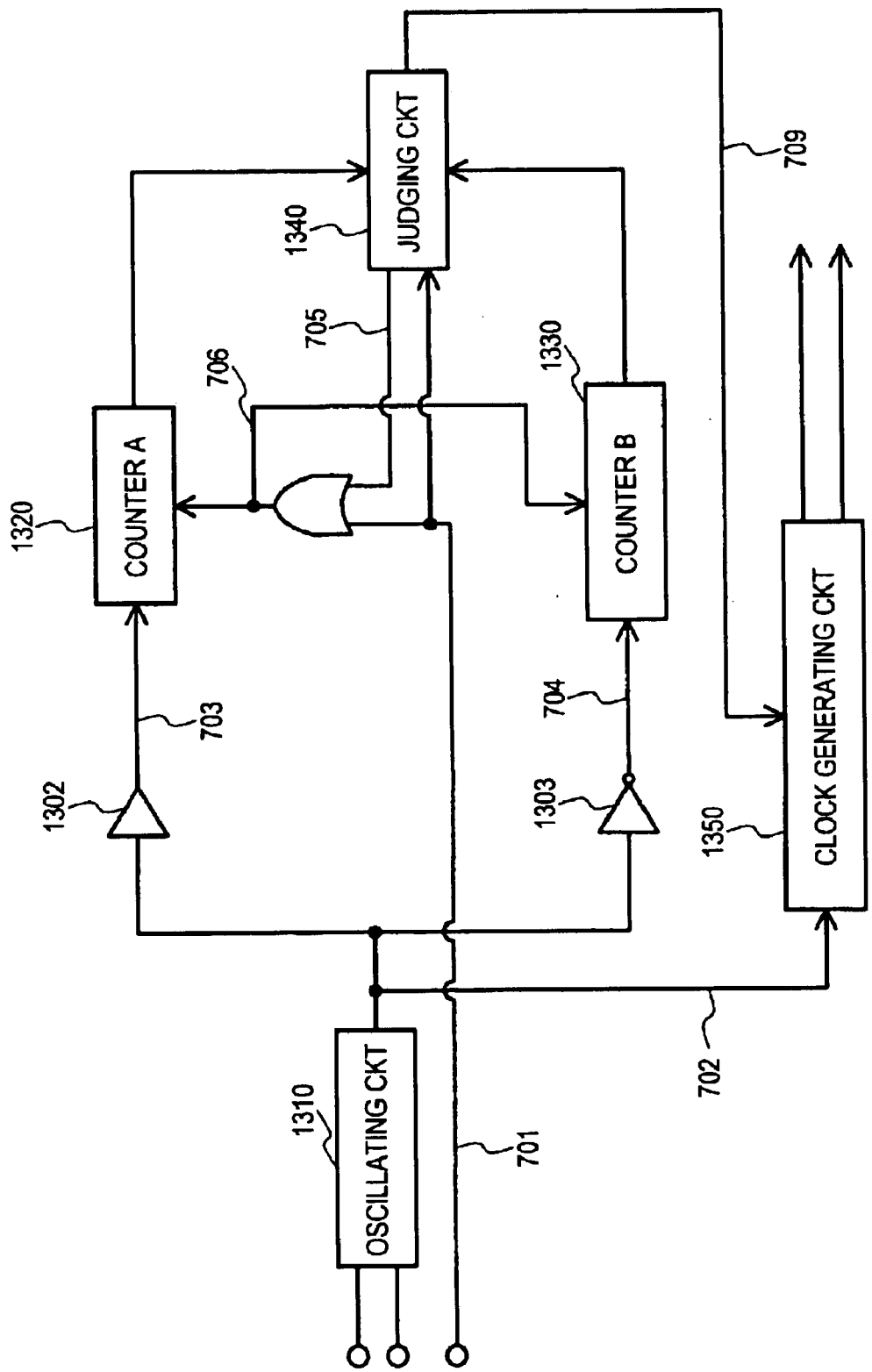
FIG. 13 is a circuit schematic diagram of a conventional clock generating circuit.
Figure 14:
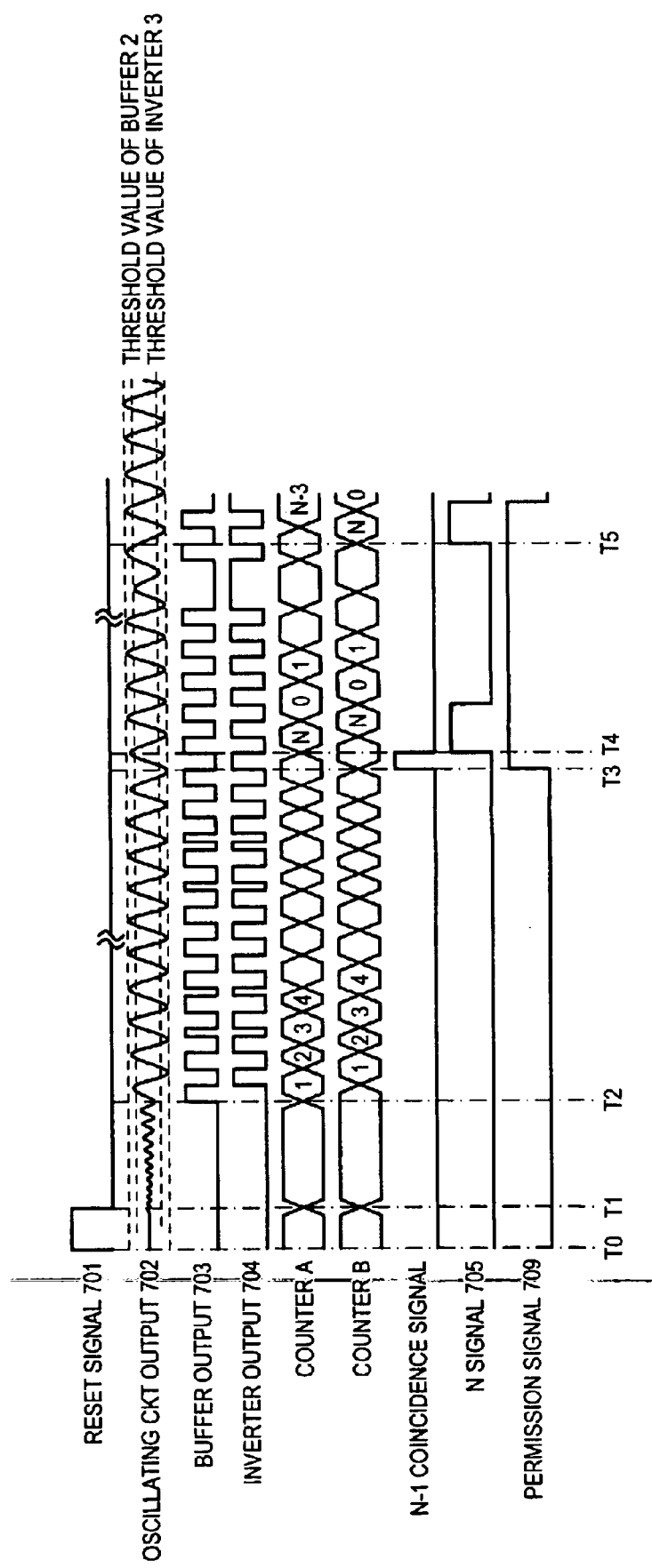
FIG. 14 is a timing diagram showing the operation of conventional clock generating circuit of FIG. 13 after a reset.
Figure 15:
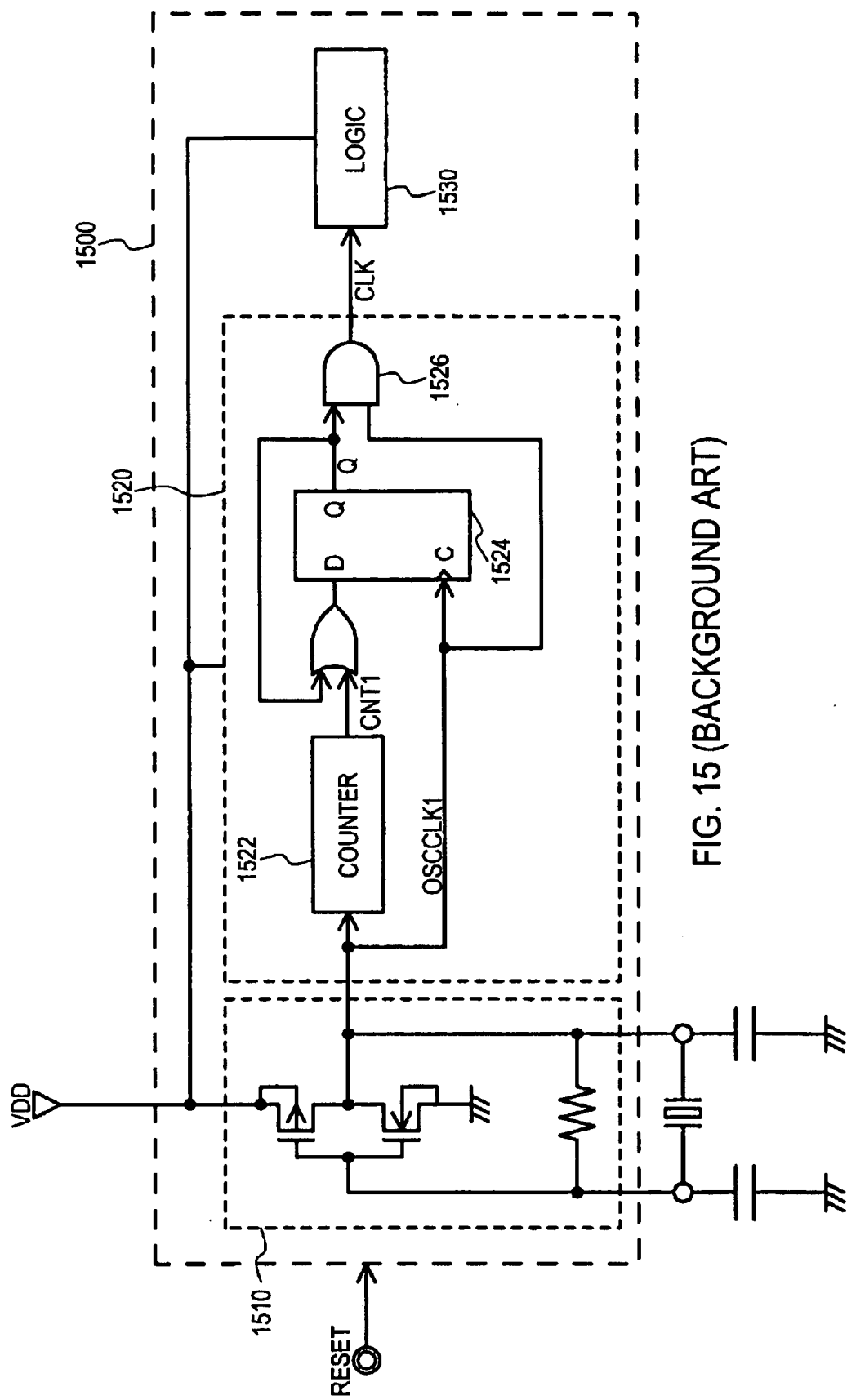
FIG. 15 is a circuit schematic diagram of a conventional clock generating circuit.
Figure 16:
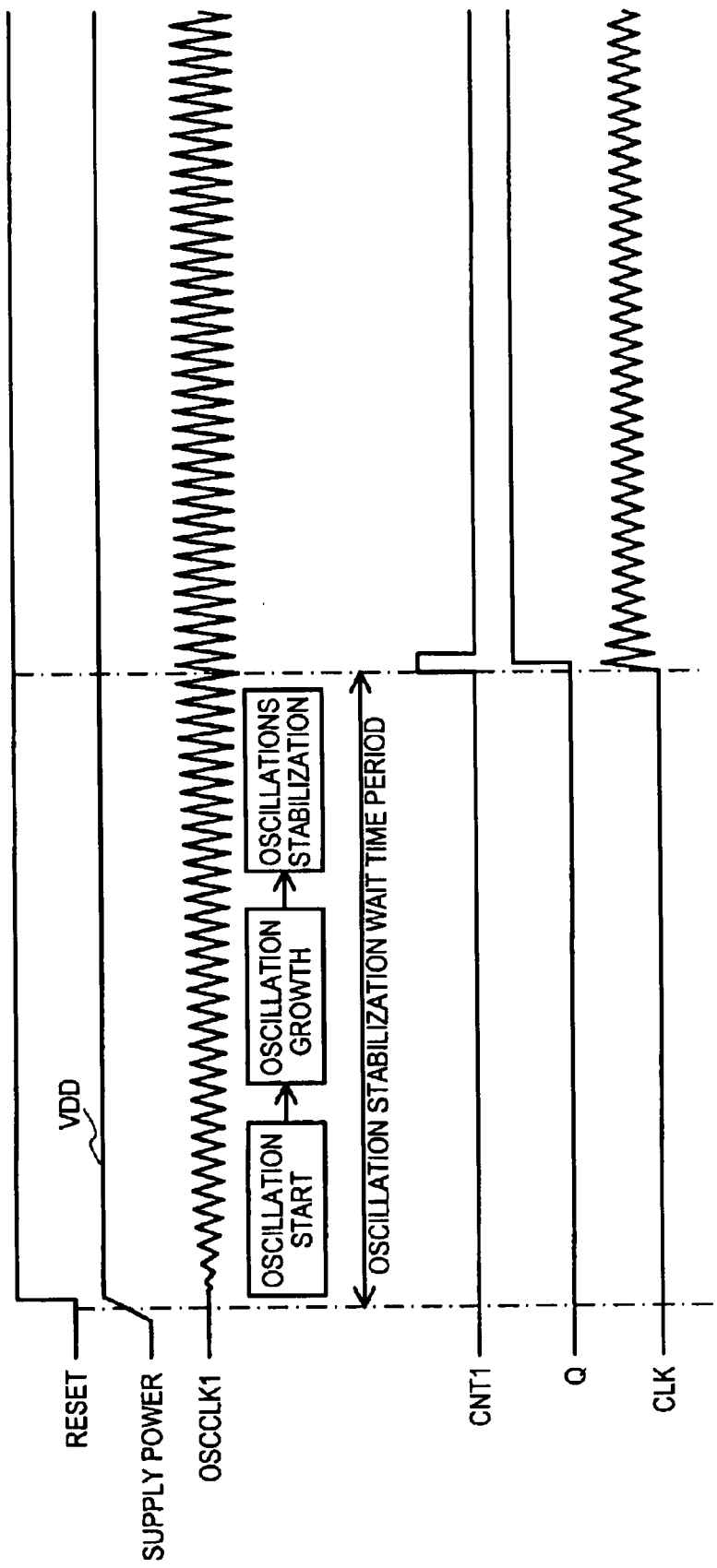
FIG. 16 is a timing diagram showing the operation of conventional clock generating circuit of FIG. 15 after a reset.

Referring now to FIG. 8, a circuit schematic diagram of a clock generating circuit according to an embodiment is set forth and given the general reference character 800.

Clock generating circuit 800 may include similar constituents as clock generating circuit 600. Such constituents may be referred to by the same reference characters and their description may be omitted.

Clock generating circuit 800 may differ from clock generating circuit 400 in that control circuit 104B may be replaced with a control circuit 104D. Control circuit 104D may include similar constituents as control circuit 104C. Such constituents may be referred to by the same reference characters and their description may be omitted.

Control circuit 104D may differ from control circuit 104C in that rising edge detecting circuit 207 may be removed, counters (209 and 210) may be replaced with an up/down counter 401, and judging circuit 211 may be replaced with a judging circuit 402.

Up/down counter 401 may receive signal 354 from AND gate 302 at an up count terminal UP and may receive signal 356 from AND gate 303 at a down count terminal DOWN. Up/down counter 401 may receive an output 355 of rising edge detection circuit 206 at a reset terminal RST1 and may receive an output 451 of judging circuit 402 at a reset terminal RST2. Up/down counter 401 may also receive second clock signal 261 at a clock terminal. Up/down counter 401 may provide an output 441 as an input to judging circuit 402. Up/down counter 401 may be reset when signal 355 provided by rising edge detection circuit 206 becomes a high level or when signal 360 provided from judging circuit 402 becomes a high level. Up/down counter 401 may count up in response to second clock signal 261 when signal 354 is high and may count down in response to second clock signal 261 when signal 356 is a high level. Accordingly, only when original clock signal 157 provided from quartz oscillating circuit 103 sufficiently grows, up/down counter 401 may count up to a given value in one logic high portion of a period of original clock signal 157 and count back down to zero in the logic low portion of the same period of original clock signal 157.

Signal 355 provided by rising edge detection circuit 206 may be provided as an input to judging circuit 402. In this way, when original clock signal 157 is sufficient to allow up/down counter 401 to count up and then count down to zero in the same period of original clock signal 157, judging circuit 402 may determine if up/down counter 401 produces a zero count at a rising edge of signal 355 provided by rising edge detection circuit 206. If up/down counter 401 produces a zero count at a rising edge of signal 355 provided by rising edge detection circuit 206, judging circuit 402 may produce a signal 360 having a high level. At this time, up/down counter 401 may be reset by signal 360. If up/down counter 401 does not produce a zero count at a rising edge of signal 355 provided by rising edge detection circuit 206, judging circuit 402 may produce a signal 360 having a high level. At this time, up/down counter 401 may be reset in response to signal 355.

When judging circuit 360 produces a signal 360 having a high level, oscillation stabilization detection signal 361 may transition from a low to a high level. In this way, synthesized clock signal 362 may be provided to internal logic circuit 105.

Other operations of clock generating circuit 800 is substantially the same as the operation of clock generating circuit 600 and thus, further description is omitted.

Yet another embodiment of a clock generating circuit will now be discussed.

A low voltage circuit may be used instead of voltage regulator 111. As a power supply of control circuit 104, a circuit may generate the power supply essentially one half of the external power supply VDD. The oscillation frequency of second oscillating circuit 208 may be stabilized using voltage regulator 111 as a power source.

According to the embodiments, the voltage which may be applied to an oscillating circuit and an internal logic circuit may switch. A synthesized clock signal may be provided to an internal logic circuit after an original clock signal provided by the oscillating circuit grows to a sufficient magnitude. In this way, an internal logic circuit may be prevented from operating in response to a clock signal that may not be stable and may prevented from running out of control while the oscillating circuit and internal logic circuit operate at a low voltage.

It is understood that the embodiments described above are exemplary and the present invention should not be limited to those embodiments. Specific structures should not be limited to the described embodiments.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A clock generating circuit, comprising:
    an oscillation circuit that generates an original clock signal;
    a charge control circuit that provides charge to a charge node when the amplitude of the original clock signal becomes at least a first predetermined value;
    a first logic circuit that generates a first control signal having a first logic level in an initial state and transitions to a second logic level in response to a potential of the charge node becoming a second predetermined value;
    a synthesized clock generating circuit that provides a synthesized clock to another circuit not included in the clock generating circuit in accordance with the first control signal and the original clock signal; and
    a switching circuit that switches a power supply that is provided to the oscillation circuit in response to the first control signal.

2. The clock generating circuit according to claim 1, further including:
    the switching circuit switches a power supply that is provided to the another circuit in response to the first control signal.

3. The clock generating circuit according to claim 1, wherein:
    the charge control circuit includes a buffer having hysteresis coupled to receive the original clock signal and providing a charge control signal that controls the charge to the charge node.

4. A clock generating circuit, comprising:
    an oscillating circuit generating an original clock signal;
    a first measuring circuit that measures a first time period in which the original clock signal is at least a first threshold value;
    a second measuring circuit that measures a second time period in which the original clock signal is at most a second threshold value;
    a first control signal generating circuit that generates a first control signal having a first logic level in an initial state and transitions to a second logic level when the first time period is essentially equal to the second time period; and
    a synthesized clock generating circuit that provides a synthesized clock to another circuit not included in the clock generating circuit in accordance with the first control signal and the original clock signal.

5. The clock generating circuit according to claim 4, further including:
    a switching circuit that switches a power supply that is provided to the oscillating circuit in response to the first control signal.

6. The clock generating circuit according to claim 4, further including:
    a switching circuit that switches a power supply that is provided to the another circuit in response to the first control signal.

7. The clock generating circuit according to claim 4, further including:

a second control circuit providing an activation signal having an activation logic level and a deactivation logic level wherein
the first and second measuring circuits are coupled to receive the activation signal and are disabled when the activation signal has the deactivation logic level.

8. The clock generating circuit according to claim 7, wherein:

the activation signal has the deactivation logic level for a predetermined time period after a power supply is turned on.

9. The clock generating circuit according to claim 8, wherein:

the predetermined time period that the activation signal has the deactivation logic level after a power supply is turned on is provided by a time constant circuit.

10. The clock generating circuit according to claim 4, further including:

a switching circuit that switches a power supply that is provided to the oscillating circuit after a predetermined time period from a power supply being turned on.

11. The clock generating circuit according to claim 10, wherein:

the predetermined time period from the power supply being turned on is determined by a time constant circuit.

12. The clock generating circuit according to claim 10, wherein:

the predetermined time period from the power supply being turned on is determined by a counter that counts a first clock signal to a predetermined value.

13. The clock generating circuit according to claim 4, further including:

a switching circuit that switches a power supply that is provided to the another circuit after a predetermined time period from a power supply being turned on.

14. A clock generating method, comprising the steps of:

generating an original clock signal with an oscillation circuit;

charging a charge node when the original clock signal reaches at least a predetermined magnitude;

generating a control signal having a first logic level in an initial state that becomes a second logic level when the charge node reaches the predetermined potential; and providing a synthesized clock signal in response to the control signal and the original clock signal; and switching a power supply that is provided to the oscillation circuit in response to the control signal.

15. The clock generating method according to claim 14, further including the step of:

switching a power supply that is provided to the another circuit than the oscillation circuit in response to the control signal.

16. A clock generating method, comprising the steps of:

generating an original clock signal with an oscillation circuit;

measuring a first time period in which the original clock signal is at least a first threshold value;

measuring a second time period in which the original clock signal is at most a second threshold value;

generating a first control signal having a first logic level in an initial state and transitions to a second logic level when the first time period is essentially equal to the second time period; and providing a synthesized clock to another circuit not included in the clock generating circuit in accordance with the first control signal and the original clock signal.

17. The clock generating method according to claim 16, further including the step of:

switching a power supply that is provided to the oscillation circuit in response to the first control signal.

18. The clock generating method according to claim 16, further including the step of:

switching a power supply that is provided to the another circuit in response to the first control signal.

19. The clock generating method according to claim 16, further including the step of:

disabling the first measuring step and the second measuring step.

20. The clock generating method according to claim 19, wherein:

the step of disabling the first measuring step and the second measuring step is performed in response to the first control signal transitioning to the second logic level.

21. The clock generating method according to claim 19, wherein:

the step of disabling the first measuring step and the second measuring step is performed for a predetermined time period after a power supply is turned on.

22. The clock generating method according to claim 21 wherein:

the predetermined time period that the first measuring step and the second measuring step are disabled after a power supply is turned on is provided by a time constant circuit.

23. The clock generating method according to claim 16, further including the step of:

switching a power supply that is provided to the oscillation circuit after a predetermined time period from a power supply being turned on.

24. The clock generating method according to claim 23, wherein:

the predetermined time period from the power supply being turned on is determined by a time constant circuit.

25. The clock generating method according to claim 23, wherein:

the predetermined time period from the power supply being turned on is determined by a counter that counts a first clock signal to a predetermined value.

26. The clock generating method according to claim 16, further including the step of:

switching a power supply that is provided to the another circuit after a predetermined time period from a power supply being turned on.

* * * * *